(12) United States Patent
Kuroishi et al.

(10) Patent No.: US 8,103,942 B2
(45) Date of Patent: Jan. 24, 2012

(54) DATA TRANSMISSION APPARATUS, DATA TRANSMISSION DEVICE, DATA RECEPTION DEVICE AND DATA TRANSMISSION SYSTEM

(75) Inventors: Norihiko Kuroishi, Kanagawa (JP); Takeshi Kamimura, Kanagawa (JP); Seiji Suzuki, Kanagawa (JP); Jun Kitamura, Kanagawa (JP); Nobuo Mori, Kanagawa (JP); Manabu Akamatsu, Kanagawa (JP); Kunihiro Seno, Kyoto (JP)

(73) Assignee: Fuji Xerox Co., Ltd., Tokyo (JP)

( * ) Notice: Subject to any disclaimer, the term of this patent is extended or adjusted under 35 U.S.C. 154(b) by 973 days.

(21) Appl. No.: 12/055,474

(22) Filed: Mar. 26, 2008

(65) Prior Publication Data

US 2008/0294966 A1    Nov. 27, 2008

(30) Foreign Application Priority Data

May 24, 2007  (JP) ................................. 2007-138255
Sep. 4, 2007  (JP) ................................. 2007-228981

(51) Int. Cl.
    *G06F 11/00*    (2006.01)
(52) U.S. Cl. ........................................ 714/776; 714/758
(58) Field of Classification Search .................. 714/776, 714/774, 758, 754, 753, 752, 751
    See application file for complete search history.

(56) References Cited

U.S. PATENT DOCUMENTS

| 5,546,409 | A | 8/1996 | Karasawa |
| 5,930,367 | A | 7/1999 | Osawa et al. |
| 2003/0204806 | A1 | 10/2003 | Hisada et al. |
| 2004/0170201 | A1 | 9/2004 | Kubo et al. |
| 2007/0038912 | A1 | 2/2007 | Hashimoto et al. |
| 2008/0152035 | A1* | 6/2008 | Lee et al. ............ 375/295 |
| 2008/0152635 | A1* | 6/2008 | Lee et al. ............ 424/93.21 |
| 2009/0217138 | A1* | 8/2009 | Touzni et al. ......... 714/776 |

FOREIGN PATENT DOCUMENTS

| CN | 1788446 A | 6/2006 |
| JP | 7-262031 | 10/1995 |
| JP | 9-128890 | 5/1997 |
| JP | 10-49997 | 2/1998 |
| JP | 2000-349792 | 12/2000 |
| JP | 2003-69535 | 3/2003 |
| JP | 2003-527721 | 9/2003 |
| JP | 2003-318865 | 11/2003 |
| JP | 2005-64888 | 3/2005 |
| JP | 2005-512352 | 4/2005 |
| WO | 01/37280 | 5/2001 |
| WO | 02/098003 | 12/2002 |

* cited by examiner

*Primary Examiner* — Dieu-Minh Le
(74) *Attorney, Agent, or Firm* — Fildes & Outland, P.C.

(57) ABSTRACT

A data transmission apparatus includes a packet generation section, a frame encoding section, a transmission section, a reception section, a frame decoding section and a packet extraction section. The packet generation section generates a packet upon request. The frame encoding section generates a frame having a predetermined length by dividing the packet or adding dummy data to the packet and generates an error-correcting-code-added frame by adding an error correcting code to the frame. The transmission section transmits the generated error-correcting-code-added frame through a transmission line. The reception section receives the error-correcting-code-added frame. The frame decoding section performs an error detection and an error correction for the error-correcting-code-added frame. The packet extraction section extracts the packet by removing the error correcting code from the error-correcting-code-added frame for which the error detection and the error correction have been performed.

16 Claims, 21 Drawing Sheets

FIG. 4

| REQUEST FROM HOST | TYPE | CODE (BINARY NUMBER) |
|---|---|---|
| WRITE | MEMORY WRITE REQUEST | 1000 |
| | MEMORY WRITE COMPLETION | 1100 |
| READ | MEMORY READ REQUEST | 0000 |
| | MEMORY READ COMPLETION | 0100 |

FIG. 6

| CONTROL SYMBOL | CORRESPONDING K CHARACTER | MEANING |
|---|---|---|
| SOP | K28.1 | BEGINNING OF PACKET |
| EOP | K28.0 | END OF PACKET |
| IDLE | K28.5 | FOR CLOCK CORRECTION |
| NOP1 | K28.3 | NO OPERATION, SYNCHRONIZING COMMA CHARACTER |
| NOP2 | K28.6 | NO OPERATION, FOR TIME SLOT PADDING |

FIG. 7

|  | MSB | | LSB |
|---|---|---|---|
| ECC+ | 00 | ECC | |
| ECC− | 11 | ECC (INVERTED) | |

|  | MSB | | LSB |
|---|---|---|---|
| K28.5+ | 10 | 10000011 | |
| K28.5− | 01 | 01111100 | |

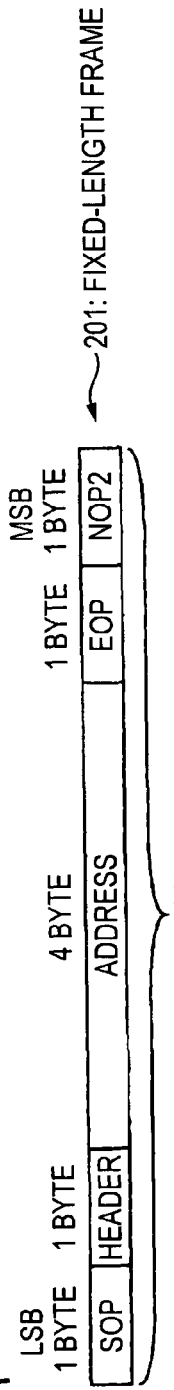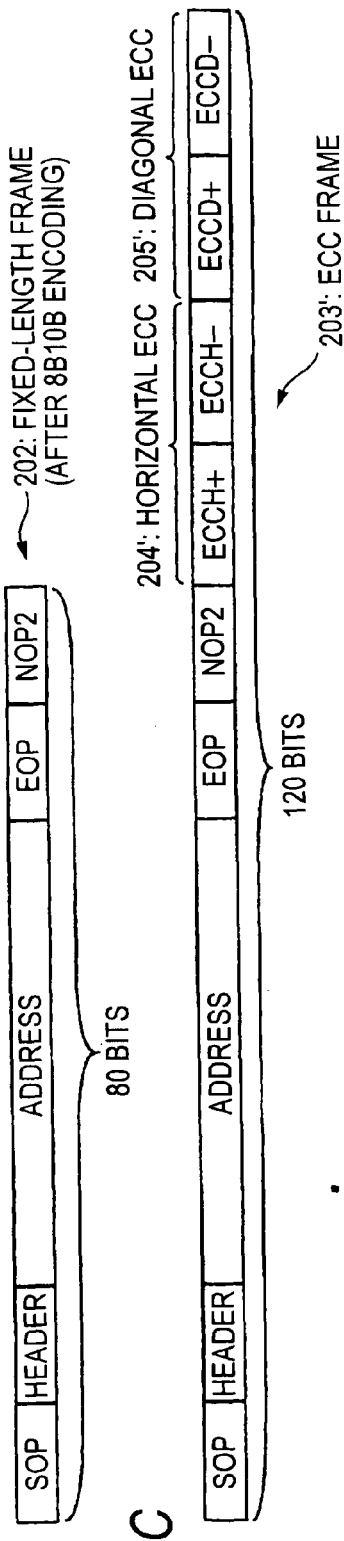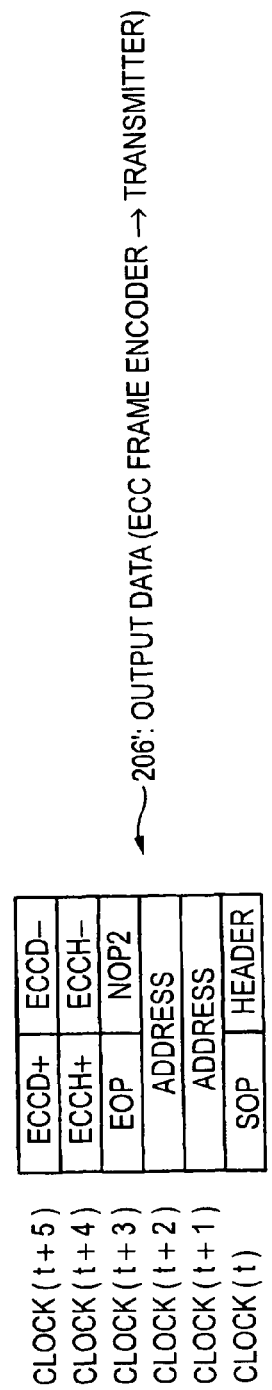

FIG. 18

| CONTROL SYMBOL | CORRESPONDING K CHARACTER | MEANING |
|---|---|---|
| SOP | K28.1 | BEGINNING OF PACKET |
| EOP | K28.0 | END OF PACKET |
| NOP | K28.6 | NO OPERATION, FOR TIME SLOT PADDING |

FIG. 19

|  | MSB | | LSB |
|---|---|---|---|
| ECCH+ | 00 | ECCH | |
| ECCH− | 11 | ECCH (INVERTED) | |

|  | MSB | | LSB |
|---|---|---|---|
| ECCD+ | 00 | ECCD | |
| ECCD− | 11 | ECCD (INVERTED) | |

DATA TRANSMISSION APPARATUS, DATA TRANSMISSION DEVICE, DATA RECEPTION DEVICE AND DATA TRANSMISSION SYSTEM

CROSS-REFERENCE TO RELATED APPLICATIONS

This application is based on and claims priority under 35 U.S.C. §119 from Japanese Patent Application Nos. 2007-138255 (filed on May 24, 2007) and 2007-228981 (filed on Sep. 4, 2007).

BACKGROUND

1. Technical Field

The invention relates to a data transmission apparatus, a data transmission device, a data reception device, and a data transmission system.

2. Related Art

Generally, in order to increase a transmission bandwidth, a method of increasing a bit width of a transmission line or a transmission frequency may be considered. Recently, according to development of semiconductor technology, the operating frequencies of CPUs or main storage memories have been increased. In consideration of the above-described situation, in a transmission line for connecting a host system and a storage device, a serial bus such as a PCI express which increases the transmission frequency by decreasing the number of bits has been dominant in the market, instead of a parallel bus such as an SCSI which increases the transmission bandwidth by increasing the bit width.

SUMMARY

According to an aspect of the invention, a data transmission apparatus includes a packet generation section, a frame encoding section, a transmission section, a reception section, a frame decoding section and a packet extraction section. The packet generation section generates a packet upon request. The frame encoding section generates a frame having a predetermined length by dividing the packet or adding dummy data to the packet and generates an error-correcting-code-added frame by adding an error correcting code to the frame. The transmission section transmits the generated error-correcting-code-added frame through a transmission line. The reception section receives the error-correcting-code-added frame through the transmission line. The frame decoding section performs an error detection and an error correction for the error-correcting-code-added frame. The packet extraction section extracts the packet by removing the error correcting code from the error-correcting-code-added frame for which the error detection and the error correction have been performed.

BRIEF DESCRIPTION OF THE DRAWINGS

Exemplary embodiments of the invention will be described in detail below with reference to the accompanying drawings, wherein:

FIG. 4 is a diagram showing meanings of types included in a packet header and allocation of binary codes according to the first exemplary embodiment of the invention;

FIG. 6 is a diagram showing a correspondence relation between special symbols and K characters according to the first exemplary embodiment of the invention;

FIG. 7 is an example of an ECC added by an ECC adding section according to the first exemplary embodiment of the invention;

FIG. 17 is a diagram showing an example of the flow of an encoding process in an ECC frame encoder according to the second exemplary embodiment of the invention before serial transmission is performed;

FIG. 18 is a diagram showing an example of correspondence between special symbols and K characters according to the second exemplary embodiment of the invention;

FIG. 19 is a diagram showing an example of an ECC added by a horizontal ECC adding section and a diagonal ECC adding section according to the second exemplary embodiment of the invention;

FIG. 20 is a diagram showing an example of calculation ranges of a horizontal ECC and a diagonal ECC according to the second exemplary embodiment of the invention.

DETAILED DESCRIPTION

First Exemplary Embodiment

A storage system to which a data transmission apparatus, a data transmission device, a data reception device, and a data transmission system according to exemplary embodiments of the invention are applied will now be described.

(Configuration of Storage System)

Figure 1:
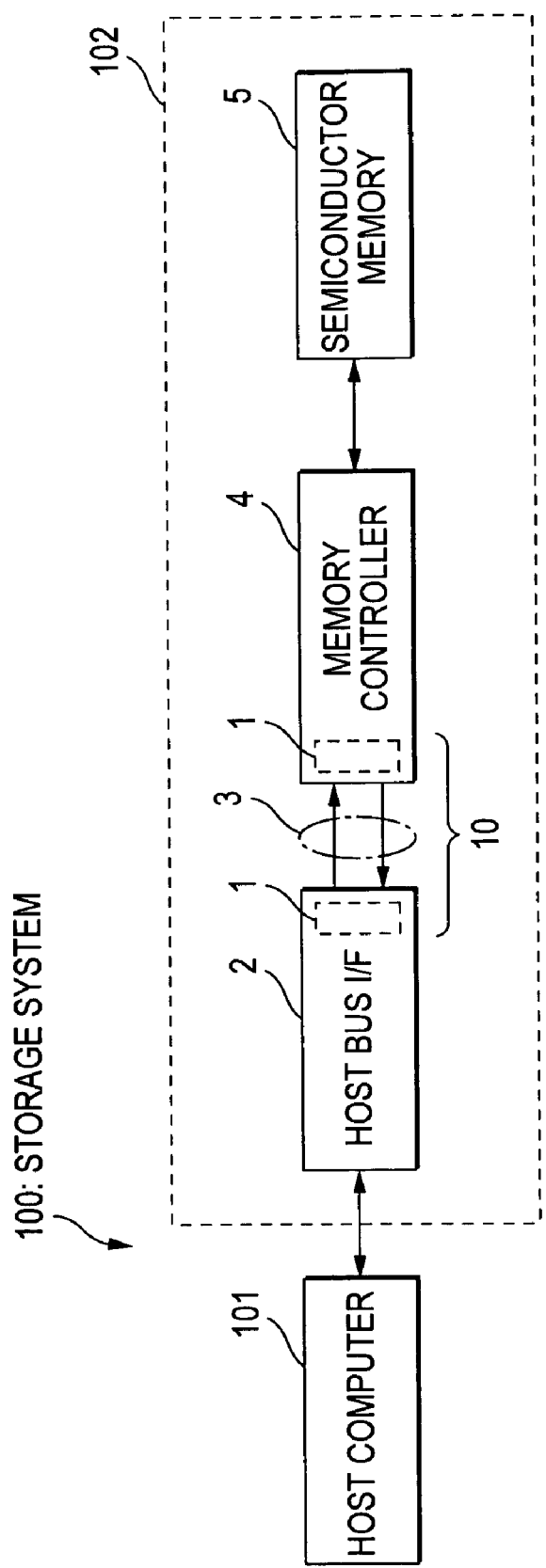
FIG. 1 is a block diagram of a storage system according to a first exemplary embodiment of the invention.

FIG. 1 shows a storage system according to an exemplary embodiment of the invention. The storage system 100 has a host computer 101 and a semiconductor disk device 102.

The semiconductor disk device 102 includes a host bus interface (I/F) 2 connected to the host computer 101, a memory controller 4 connected to the host bus I/F 2 through a serial transmission line 3 such as PCI Express, and a semiconductor memory 5 that stores data therein.

The host bus I/F 2 and the memory controller 4 are connected together by data transmission apparatuses 1 that are provided therein and use high-speed serial transmission technology. The data transmission apparatus 1 includes a data transmission device and a data reception device. A data transmission system 10 is configured by a data transmission device that is in one of the host bus I/F 2 and the memory controller 4, a serial transmission line 3, and a data reception device that is in the other.

The host bus I/F 2 interprets a command issued by the host computer 101 and instructs the memory controller 4 to access the semiconductor memory 5 through the data transmission apparatus 1. Also, when the result of the access is returned from the memory controller 4, the host bus I/F 2 informs the host computer 101 of completion of the process and replies data in accordance with the command issued by the host computer 101.

When receiving the instruction transmitted from the host bus I/F 2, the memory controller 4 accesses the semiconductor memory 5 and returns the result of the access to the host bus I/F 2 through the data transmission apparatus 1.

(Configuration of Data Transmission Apparatus)

Figure 2:
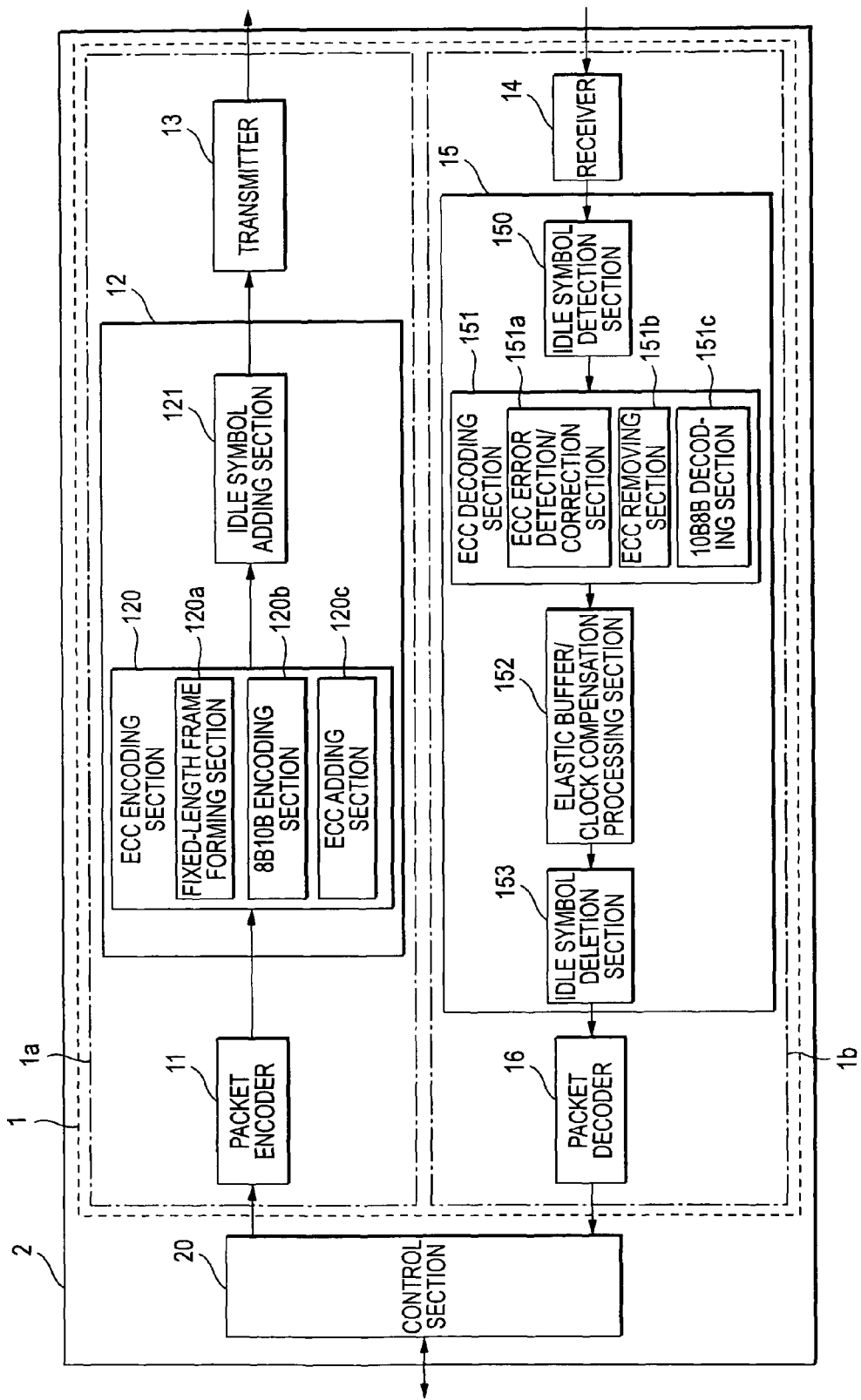
FIG. 2 is a block diagram of a data transmission apparatus according to the first exemplary embodiment of the invention disposed in a host bus I/F.

FIG. 2 shows the configuration of a data transmission apparatus 1 disposed in the host bus I/F 2. Since the configuration of the data transmission apparatus 1 disposed in the memory controller 4 is the same as that shown in FIG. 2, a description thereof will be omitted. As described above, the data transmission apparatus 1 is configured to have the data transmission device 1a and the data reception device 1b.

The data transmission device 1a includes: a packet encoder (packet generation section) 11 that generates a packet upon request from a control section 20 that controls the host bus I/F 2; an ECC frame encoder (frame encoding section) 12 that generates an ECC (error correcting code) frame from the generated frame; and transmitter (transmission section) 13 that converts the ECC frame from parallel data into serial data and transmits the converted data.

The data reception device 1b includes: a receiver (reception section) 14 that converts the received ECC frame from serial data into parallel data; and ECC frame decoder (frame decoding section) 15 that performs an error detection and an error correction based on the ECC; and a packet decoder (packet extraction section) 16 that extracts a packet from the ECC frame.

(ECC Frame Encoder)

The ECC frame encoder 12 includes an ECC encoding section 120 and an IDLE symbol adding section 121.

The ECC encoding section 120 includes a fixed-length frame forming section 120a, and 8B10B encoding section 120b, and an ECC adding section 120c.

The fixed-length frame forming section 120a forms a frame (hereinafter, referred to as a "fixed-length frame") having a predetermined length (for example, 8 bytes) by dividing the packet generated by the packet encoder 11 or adding dummy data to the packet.

The 8B10B encoding section 120b performs an 8B10B encoding operation (DC balance conversion) for the fixed-length frame formed by the fixed-length frame forming section 120a to form an 80-bit frame. Here, a DC balance conversion method such as 4B5B or 64B66B other than the 8B10B coding may be used.

The ECC adding section 120c adds an ECC to the 8B10B-encoded frame to generate a 100-bit ECC frame. As the ECC, a known correction code such as a Hamming code, a Manchester code, or a Reed-Solomon code may be used.

The IDLE symbol adding section 121 outputs an IDLE symbol (IDLE code) at a time of a clock compensation sequence. Here, the clock compensation sequence is for correcting a reception timing by inserting a sequence including a predetermined symbol (for example, an idle symbol) between the EEC frames.

(ECC Frame Decoder)

The ECC frame decoder 15 includes an IDLE symbol detection section 150 for detecting an IDLE symbol, an ECC decoding section 151, and elastic buffer/clock compensation processing section 153 and an IDLE symbol deletion section 153.

The ECC decoding section 151 includes: an ECC error detection/correction section 151a that performs an ECC error detection/correction operation using the ECC included in the parallel data transmitted from the receiver 14; an ECC removing section 151b that removes the ECC after the ECC error detection/correction operation, and a 10B8B decoding section 151c that performs a 10B8B decoding process for 80-bit data, from which the ECC has been removed, to generate 64-bit data.

(Configuration of Packet)

Next, the packet generated by the packet encoder 11 will be described with reference to FIGS. 3 and 4.

Figure 3:
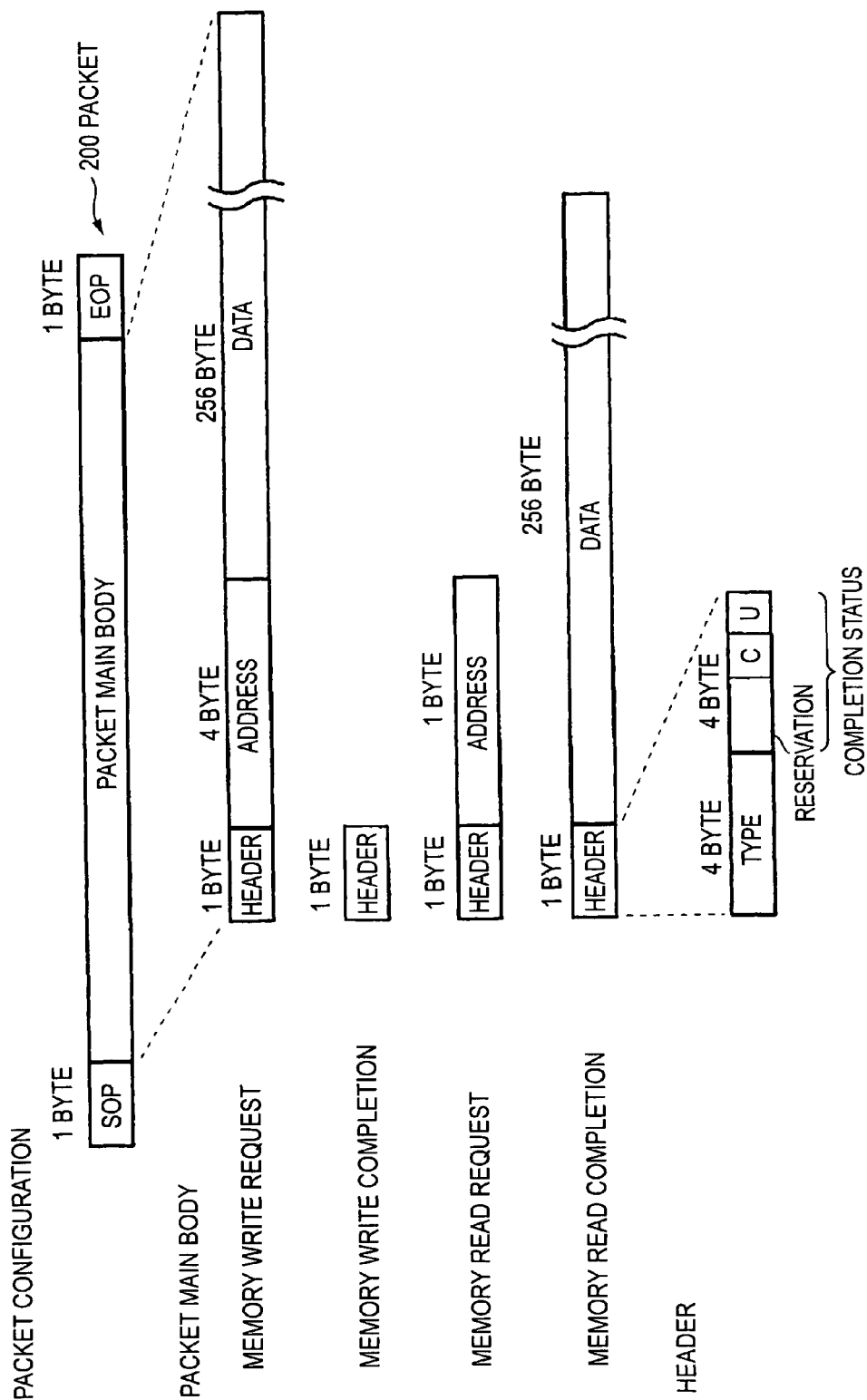
FIG. 3 is a diagram showing the configuration of a packet generated by a packet encoder according to the first exemplary embodiment of the invention, as an example.
Figure 5:
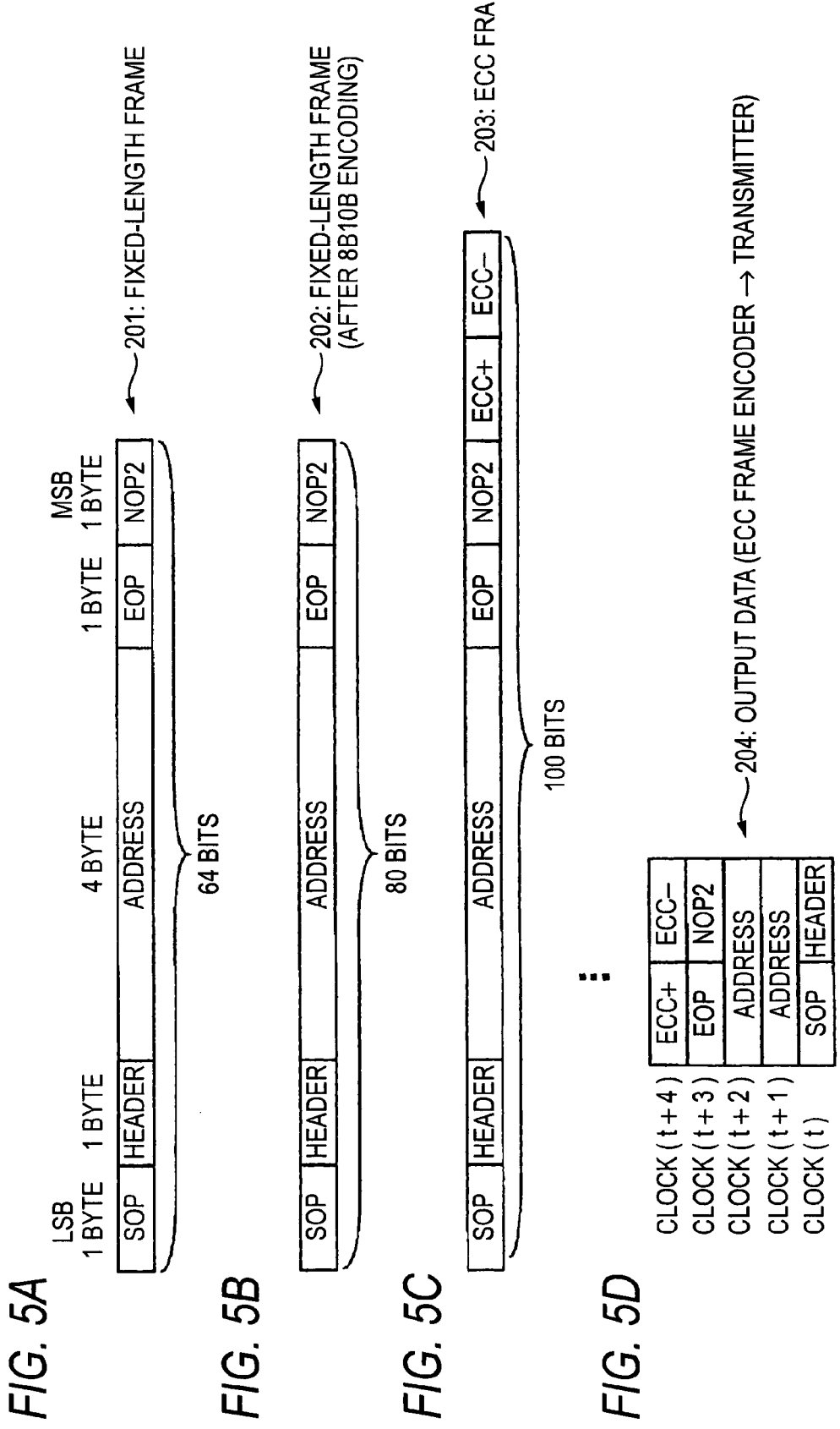
FIGS. 5A to 5D are diagrams showing a flow of an encoding process in an ECC frame encoder according to the first exemplary embodiment of the invention before serial transmission is performed, as an example.

FIG. 3 shows the configuration of the packet generated by the packet encoder 11 as an example. As shown in "Packet Configuration," a packet 200 is configured to start with SOP (Start of Packet) of one byte, followed by a packet main body, and ends with EOP (End of Packet) of one byte. The SOP and EOP are encoded using the 8B10B coding and converted into K characters before being transmitted. Accordingly, the reception side can easily extract a packet.

The packet main body takes one format from among a memory write request, a memory write completion, a memory read request and a memory read completion, in accordance with a command issued by the host computer 101 and a transmission source that transmits the packet.

The memory write request is a packet issued by the host bus I/F 2 when the host bus I/F 2 receives a write request from the host computer 101.

The memory write completion is a packet issued by the memory controller 4. When the memory controller 4 receives a memory write request from the host bus I/F 2, the memory controller 4 issues the memory write completion to notify the completion of the process after the memory controller 4 writes data stored in a data field into an address designated by an address field of the memory write request.

The memory read request is a packet issued by the host bus I/F 2 when the host bus I/F 2 receives a read request from the host computer 101.

The memory read completion is a packet issued by the memory controller 4. When the memory controller receives a memory read request from the host bus I/F 2, the memory controller 4 stores read data into a data field while notifying the completion of the process after reading the data at an address designated by an address field of the memory read request from the semiconductor memory 5 and then issues the memory read completion.

A header is formed of one byte having a type of 4 bits and a completion status of 4 bits. The completion status is valid only for the header of the memory write completion and the header of the memory read completion and is used for determining as to whether or not data transmission/reception has been normally performed.

The completion status includes a reservation field, a C field, and a U field. The U field indicates a fatal error and notifies the host computer 101 that a process cannot be continued in this status. The C field indicates an error that can be corrected. The C field notifies the host computer 101 that there is a correctible error, and prevents the error from developing to an uncorrectable error, for example, by rewriting corrected data after a correctible memory error is detected.

FIG. 4 shows meaning of the types of allocation of binary codes. To the memory write request, the memory write completion, the memory read request, and the memory read completion, binary codes of (1000), (1100), (0000), and (0100) are allocated.

(Whole Operation of Storage System)

Next, the whole operation of the storage system 100 will be described. When the host computer 101 issues an access command to the semiconductor disk device 102, the host bus I/F 2 interprets the command transmitted from the host computer 101 and instructs the memory controller 4 to access the semiconductor memory 5 through the data transmission apparatus 1.

When the memory controller 4 receives the instruction, the memory controller 4 accesses the semiconductor memory 5 and returns a result of the access to the host bus I/F 2 though the data transmission apparatus 1. When the result of the access is returned from the memory controller 4, the host bus I/F 2 notifies the host computer 101 of the completion of the process and replies data in response to the command issued by the host computer.

(Whole Operation of Data Transmission Apparatus)

(1) Operation of Transmission Side

Next, operations of the data transmission apparatus 1 on the transmission side (data transmission device 1a) will be described with reference to FIGS. 5 to 9. FIGS. 5A to 5D show a flow of an encoding process in the ECC frame encoder 12 before serial transmission.

The packet encoder 11 of the data transmission apparatus 1 generates a packet in response to a request from the control section 20, which controls the host bus I/F 2.

As shown in FIG. 5A, the fixed-length frame forming section 120a of the ECC encoding section 120 forms a fixed-length frame 201 of 8 bytes by dividing the packet generated by the packet encoder 11 or by adding dummy data to the packet. The 8 byte fixed-length frame 201 is generated at a predetermined cycle and output regardless of existence of a packet to be transmitted. At this time, if there is no packet to be transmitted, the fixed-length frame is configured of 8 bytes with being filled with an NOP2 symbol (a symbol that is ignored on the reception side). On the other hand, if there is a packet to be transmitted, 8 bytes including the packet is generated. If a length of the packet exceeds 8 bytes, leading 8 bytes of the packet are collectively processed, and the remaining part of the packet is collectively processed in units of 8 bytes.

As shown in FIG. 5B, the 8B10B encoding section 120b performs the 8B10B coding for the fixed-length, to generate an 80 bit fixed-length frame 202. Since CDR technology is used in serial transmission, the 8B10B encoding is performed for each 8-byte to be converted into 80 bits. At this moment, special symbols such as the SOP, the EOP, and the NOP2 are converted into corresponding K characters. A correspondence relationship between the special symbols and the K characters is shown in FIG. 6.

The ECC adding section 120c adds an ECC to the 8B10B-encoded 80-bit frame to generate an ECC frame 203 as shown in FIG. 5C, thereby enabling the reception side to perform correction even if one bit error occurs in transmission.

FIG. 7 shows an example of the ECC added by the ECC adding section 120c. Although the ECC of 8 bits is sufficient for 80 bits, the ECC is not encoded by the 8B10B coding. Thus, inverted 8 bits are added thereto in consideration of the DC balance. At this moment, 2 bits as shown in FIG. 7 are added to each 8-bit, so that the ECC can be distinguished from a K28.5 symbol used for the clock compensation sequence. Hereinafter, a total of 100 bits will be collectively referred to as an "ECC frame."

Figure 8:
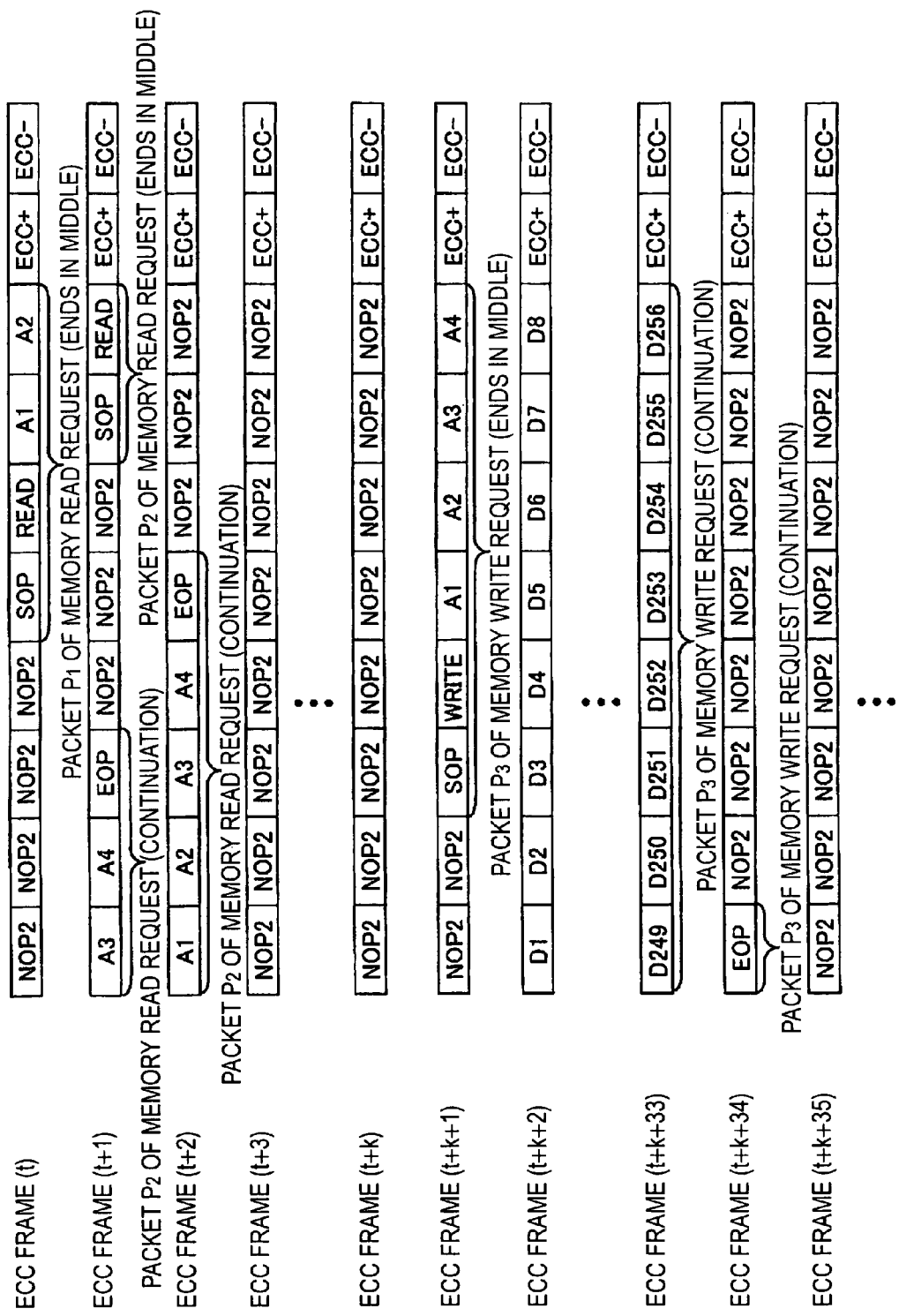
FIG. 8 is a diagram showing an example of an ECC frame according to the first exemplary embodiment of the invention.

FIG. 8 shows an example of ECC frames generated by the ECC adding section 120c. In the figure, reference symbols A1 to A4 each represents a one-byte address. Reference symbols D1 to D256 each represents one-byte data. An "ECC frame (t)" at time t represents an ECC frame generated at time t. There may be a case where contents of one packet are included in two ECC frames like ECC frames "ECC frame (t)" to "ECC frame (t+1)." Also, there may be a case where a portion of plural packets is included in one ECC frame, like the "ECC frame (t+1)." In addition, there may be a case where a packet is not included in the ECC frame like "ECC frame (t+3)," "ECC frame (t+k)" and "ECC frame (t+k+35)." Furthermore, there may be a case where one packet is included in plural ECC frames like "ECC frame (t+k+1)," "ECC frame (t+k+2)," ECC frame (t+k+33)" and "ECC frame (t+k+34)".

Then, as shown in FIG. 5D, the ECC adding section 120c divides the ECC frame 203 into five pieces of 20-bit data and output one 20-bit data to the transmitter 13 for each clock cycle, that is, output 20-bit data five times.

Figure 9:
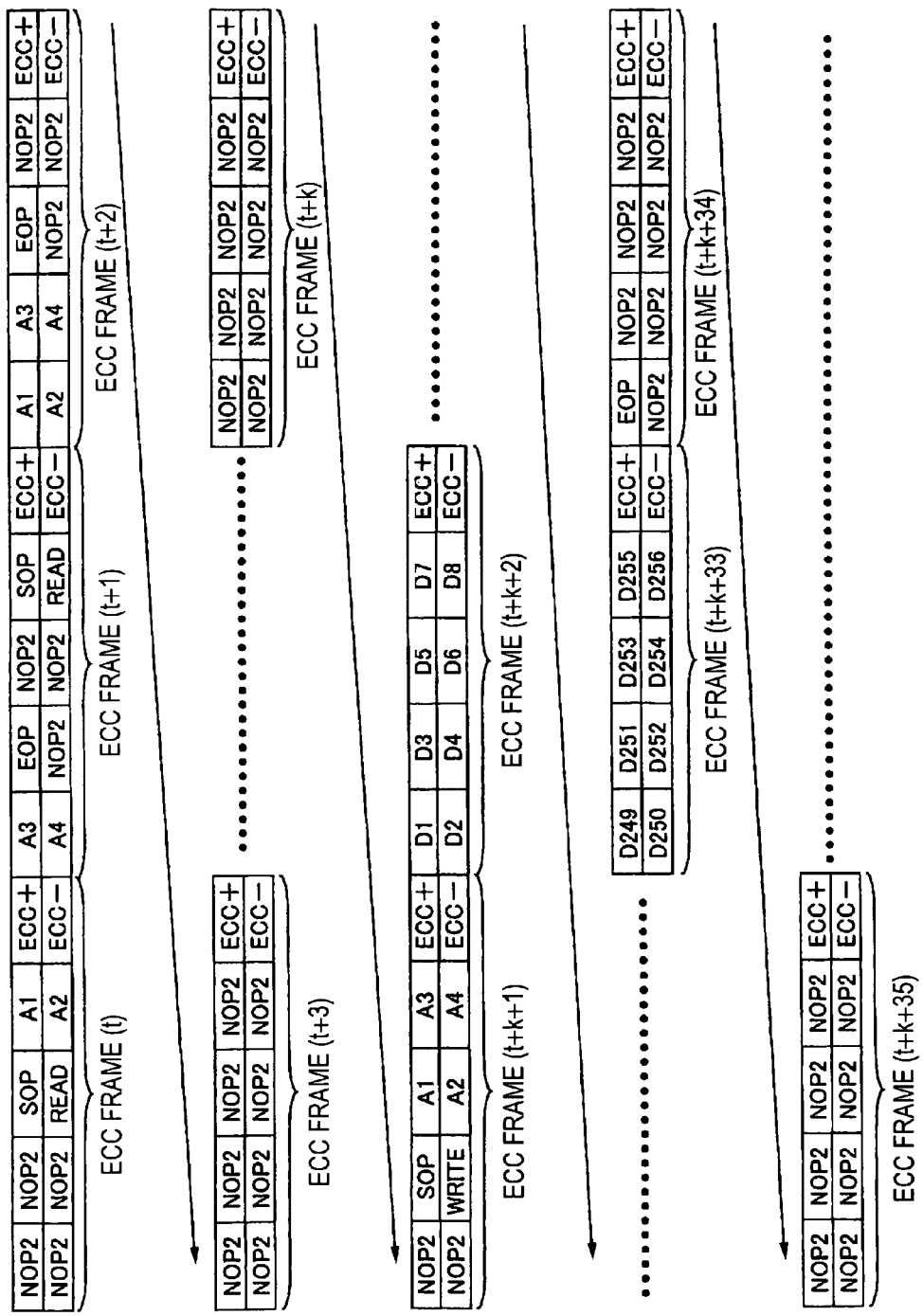
FIG. 9 is a diagram showing a state in which the ECC frame shown in FIG. 8 is output in units of 20 bits, according to the first exemplary embodiment of the invention.

FIG. 9 shows the case where the ECC frame shown in FIG. 8 is output in units of 20 bits. The transmitter 13 converts the 20 bits from parallel data into serial data and sequentially outputs the converted data to the transmission line.

(2) Process Operation on Reception Side

A decoding process performed by the reception side (data reception device 1b) of the data transmission apparatus 1 is a reverse process of the process described above. The receiver 14 performs serial-to-parallel conversion for the serial data input from the transmission line and outputs 20-bit parallel data to the ECC frame decoder 15 in each clock cycle.

When receiving the 20-bit parallel data through the IDLE symbol detection section 150, the ECC error detection/correction section 151a of the ECC frame decoder 15 forms 100 bits by bringing the 20-bit parallel data for five cycles together and performs an ECC error detection/correction process using an ECC included in the 100 bits.

Then, the 10B8B decoding section 151c performs the 8B10B decoding process for the 80 bits from which ECC is removed by the ECC removing section 151b, to restore 64 bits. The ECC frame decoder 15 deletes NOP1 and NOP2 from each 8-bit of the restored 64 bits and transmits the remaining part to the packet decoder 16 through the elastic buffer/clock compensation processing section 152 and the IDLE symbol deletion section 153.

(3) Clock Compensation Sequence

On the transmission and reception sides of the data transmission apparatus 1, clock generators not shown in the figure are provided. The clock generators are used as reference clocks. However, even if clock generators having the same frequency are used, there is a slight frequency deviation between the clock generators, and there is a possibility that an overflow or an underflow may occur in an elastic buffer of the receiver 14. Thus, a buffer control process is performed using a data array called a clock compensation sequence to which a special character K that is recognizable by the receiver 14 is allocated. This sequence is recognized inside the receiver 14, and an amount of data is increased or decreased for buffer adjustment. Accordingly, the sequence cannot be included in the ECC frame. Thus, the sequence is inserted between the ECC frames, if necessary. In other words, an error correction process using the ECC cannot be applied to this sequence.

Figure 10:
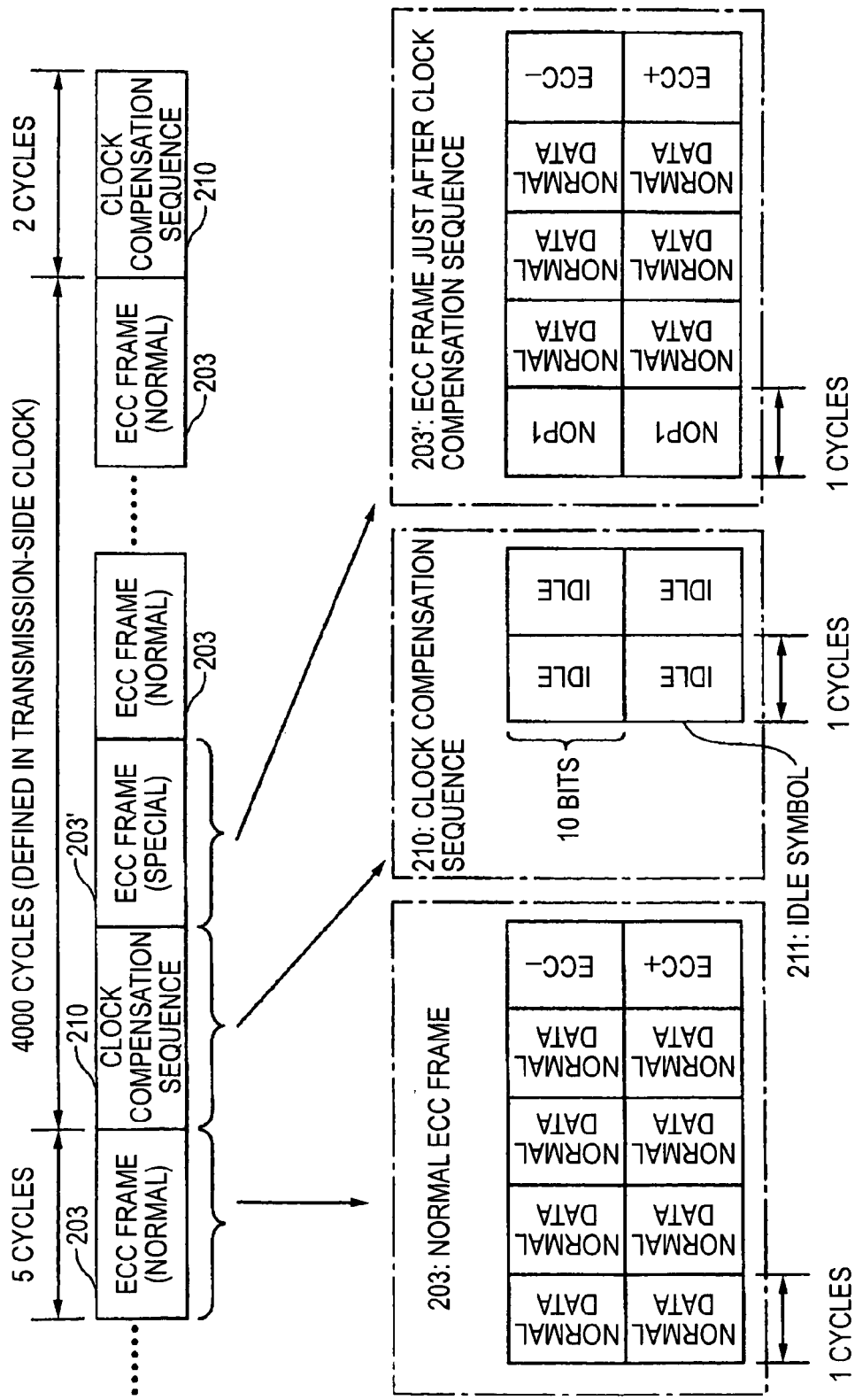
FIG. 10 is a diagram showing an example of a frame at a time of inserting clock compensation sequence, according to the first exemplary embodiment of the invention.

FIG. 10 shows an example of a frame in the case where a clock compensation sequence is inserted. The IDLE adding section 121 of the ECC frame encoder 12 is controlled to output a clock compensation sequence 210 each 4,000 cycles. One clock compensation sequence 210 includes two consecutive cycles each has two IDLE symbols 211. A length of one cycle is defined based of of a used transceiver and frequency variation in used reference clock generators. The reason why the clock compensation sequence includes two cycles is that even if one-bit error occurs in one cycle, there remains at least one cycle in which no bit error occurs. With this configuration, it is possible to prevent the occurrence of a fatal overflow or underflow of the elastic buffer due to the one-bit error.

The ECC encoding section 120 is configured to include the NOP1 symbol in the leading portion of the ECC frame 203' that is firstly output after the IDLE symbol 211 is output. This is intended to prevent that data having a close Hamming distance from the IDLE symbol 211 is arranged in data just after the IDLE symbol 211.

(3-1) Normal Operation of Clock Compensation Sequence

The serial data input to the receiver 14 is converted into parallel data by the serial-to-parallel conversion section inside the receiver 14 and is input to the ECC decoding section 151 of the ECC frame decoder 15. After the ECC decoding section 151 performs the error correction for the 8B10B-decoded data, the 8-B10B-decoded data is input to the elastic buffer/clock compensation processing section 152.

In the elastic buffer/clock compensation processing section 152, in order to maintain a half-full state of the buffer (FIFO), deletion or copy of the clock compensation sequence symbols (IDLE symbols), which are regularly output from the transmitter 13, is performed.

The receiver 14, the ECC decoding section 151, and a write processing section of the elastic buffer are synchronized with a recover clock (that is, the clock on the transmitter 13 side) extracted from the serial data input from the receiver 14, and respective sections subsequent to a read-out processing section of the elastic buffer are synchronized with a local clock. Thereby, deviation between the clock frequencies on the transmission and reception sides can be absorbed.

From the data output from the elastic buffer/clock compensation processing section 152, the IDE symbols unrelated to the packet is deleted by the IDLE symbol deletion section 153, and then the data is input to the packet decoder 16.

According to the above processes, a special process for correcting an error of the clock compensation sequence (IDLE symbol) is not required, and the error of the clock compensation sequence can be collectively corrected by the ECC decoding section 151 together with normal data.

(3-2) Operation in Case Where Bit Error Occurs in Clock Compensation Sequence

Figure 11:
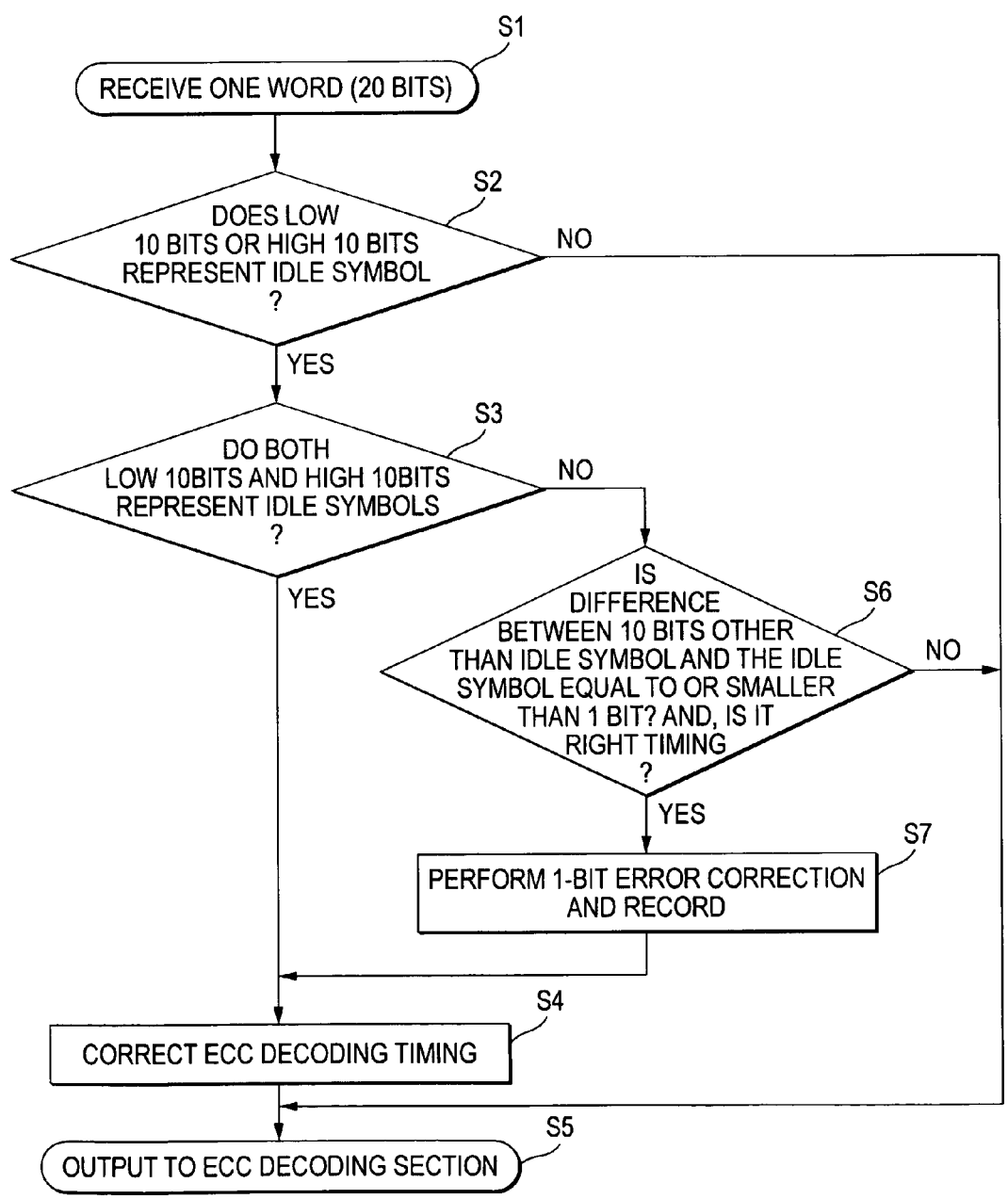
FIG. 11 is a diagram showing an example of a handling flow according to the first exemplary embodiment of the invention in the case where a bit error occurs in the clock compensation sequence.

FIG. 11 shows an example of a flow for dealing with the case where a bit error occurs in the clock compensation sequence. When a one-bit error occurs in the clock compensation sequence, the sequence is not recognized as a clock compensation sequence inside the receiver 14 and is transmitted to the ECC frame decoder 15 as it is.

When the ECC frame decoder 15 receives 20 bits from the receiver 14 (S1), the IDLE symbol detection section 150 determines as to whether low 10 bits or high 10 bits in the received 20 bits or the high 10 bits represents the IDLE symbol (S2: Yes), it is determined as to whether both of the low 10 bits or the high 10 bits represents the IDLE symbol (S2: Yes), it is determined as to whether both of the low 10 bits and the high 10 bits represent the IDLE symbol (S3). When both of the low 10 bits and the high 10 bits represent the IDLE symbol (S3: Yes), the received 20 bits are determined to be a clock compensation sequence, a timing of the ECC decoding section 151 is corrected such that the next received data becomes a leading portion of the frame (S4), and the received 20 bits are output to the ECC decoding section 151 (S5). The both IDLE symbols are deleted by the IDLE symbol deletion section 153.

When both of the high 10 bits and the low 10 bits in the received 20 bits do not represent the IDLE symbol (S2: No), the IDLE symbol detection section 150 does not correct the timing of the ECC decoding section 151 and outputs the received 20 bits to the ECC decoding section 151 (S5).

When one of the high 10 bits and the low 10 bits represents the IDLE symbol (S2: Yes) and both do not represent the IDLE symbol (S3: No), the 20 bits are determined to be a clock compensation sequence in the case where (1) a Hamming distance between the other 10 bits and the IDLE symbol, that is a difference therebetween is equal to or less than one bit and (2) it is a timing for receiving the IDLE symbol (S6: Yes), the IDLE symbol detection section 150 determines the 20 bits to be a clock compensation sequence. Then, the one-bit error is corrected (S7), the timing of the ECC decoding section 151 is corrected such that the next received data becomes a leading portion of a frame (S4), and the received 20 bits are output to the ECC decoding section 151 (S5).

Also, the condition "(2)" of the above described conditions may be determined to be satisfied if the following conditions are satisfied:

(a) <During Link Initialization Process>

Since there is a possibility that synchronization is not established during link initialization, the condition "(2)" is forcedly satisfied.

(b) <IDLE Reception Timing Match>

It is determined as to whether a timing matches 4,000 cycles. In other words, after the transmission side and the reception side are synchronized with each other, it is determined that the timings are matched up to a predetermined number of cycles, and the condition "(2)" is forcedly satisfied.

(c) <Case Where IDLE Symbol Is Received In Immediately Preceding Clock Cycle>

Generally, two cycles of the clock compensation sequences are consecutively transmitted. Also, when the clock compensation sequence is recognized by the receiver 14, there is a possibility that the clock compensation sequence is further copied based on a state of the elastic buffer and output to the ECC frame decoder 15. Therefore, when the immediately preceding clock cycle is the clock compensation sequence, there is a high possibility that the next cycle is also the clock compensation sequence. Thus, the condition "(2)" is forcedly achieved.

By performing the above-described processes, even if a one-bit error occurs in the clock compensation sequence, the error can be corrected without any problem. In addition, since the NOP1 symbol is always arranged after the IDLE symbol, the NOP1 symbol is not wrongly recognized as the clock compensation sequence even if the NOP1 symbol changes due to the one-bit error. Furthermore, instead of the above-described determination of a condition in Step S6 shown in FIG. 11, the following flow may be used: that is, if the Hamming distance, that is, a difference between (i) 10 bits other than the IDLE symbol and (ii) the IDLE symbol is equal to or less than one bit, "S6: YES" is determined and the control proceeds to the process of Step S7.

Figure 12:
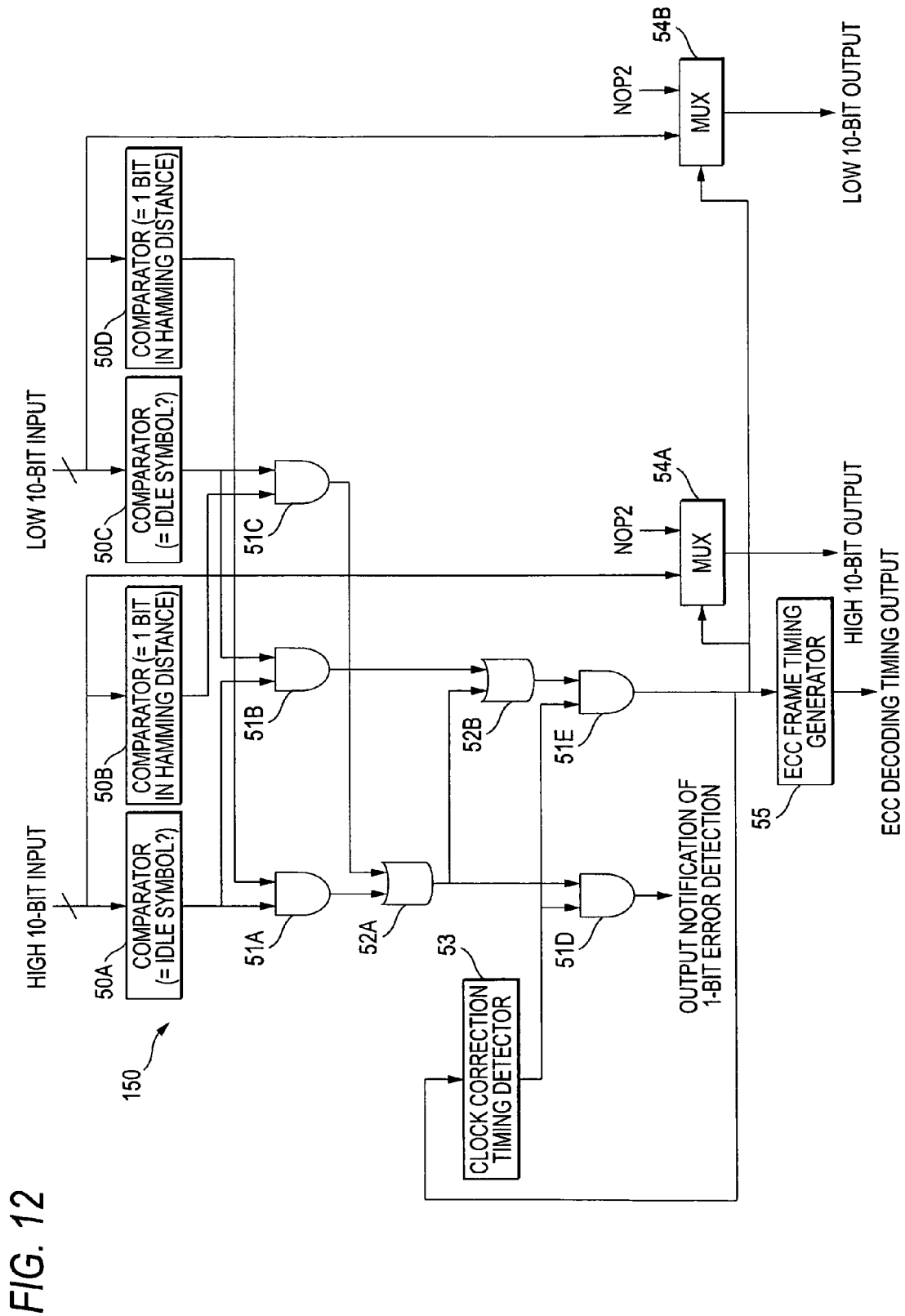
FIG. 12 is a diagram showing the configuration of an IDLE symbol detection section according to the first exemplary embodiment of the invention, as an example.

FIG. 12 is the configuration of the IDLE symbol detection section 150 for implementing the flow shown in FIG. 11, as an example. The IDLE symbol detection section 150 includes first to fourth comparators 50A to 50D, first to fifth AND circuits 51A to 51E, first and second OR circuits 52A and 52B, a clock collection timing detector 53, first and second multiplexers (MUX) 54A and 54B, and an ECC frame timing generator 55.

The first comparator 50A determines as to whether the high 10 bits represent the IDLE symbol. The second comparator 50B determines as to whether the Hamming distance from the high 10 bits is equal to or less than one bit. The third comparator 50C determines as to whether the low 10 bits represent the IDLE symbol. The fourth comparator 50D determines as to whether the Hamming distance from the low 10 bits is equal to or less than one bit. If both the high 10 bits and the low 10 bits represent the IDLE symbol or if the Hamming distance from 10 bits other than the IDLE symbol is equal to or less than one bit, a timing signal based on the IDLE symbol is output from the ECC frame timing generator 55. The notification of one-bit error correction is output from the fourth AND circuit 51D.

(Another Example of Clock Compensation Sequence)

Figure 13:
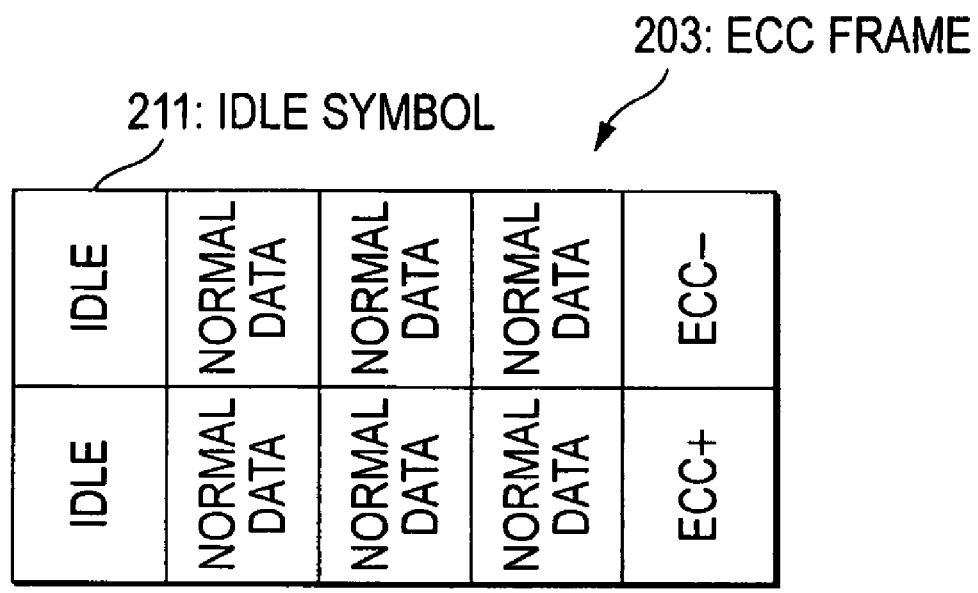
FIG. 13 is a diagram showing another example of the clock compensation sequence.

FIG. 13 shows another example of the clock compensation sequence. In the above-described embodiment, the clock compensation sequence is inserted between the ECC frames. However, as shown in FIG. 13, a clock compensation sequence constituted by the IDLE symbol 211 may be embedded in the ECC frame 203 like normal data. In this case, as described above, the error correction can be made. Since the clock compensation sequence is inserted into the elastic buffer after the error correction is made, one set of IDLE symbols 211 including the high 10 bits and the low 10 bits may be used. With this configuration, since the IDLE symbol 211 is not required to be detected before the error correction is made, data apart from the IDLE symbol 211 in Hamming distance is not needed to be arranged just thereafter.

Also, in the above-described clock compensation sequence, two IDLE symbols are used for dealing with a bit error. However, number of the IDLE symbols is not limited to two. Three or more IDLE symbols may be used for dealing with a bit error. For example, such a configuration that the IDLE symbol adding section 121 transmits four IDLE symbols (each having five bits) and that if all the received symbols is identical with the IDLE symbol and if a Hamming distance between (i) 5 bits which are not identical with the IDLE symbol and the IDLE symbols is equal to or less than 1, the ECC frame decoder 15 determines that the received 20 bits are a clock compensation sequence and performs a code timing process using the ECC.

Figure 14:
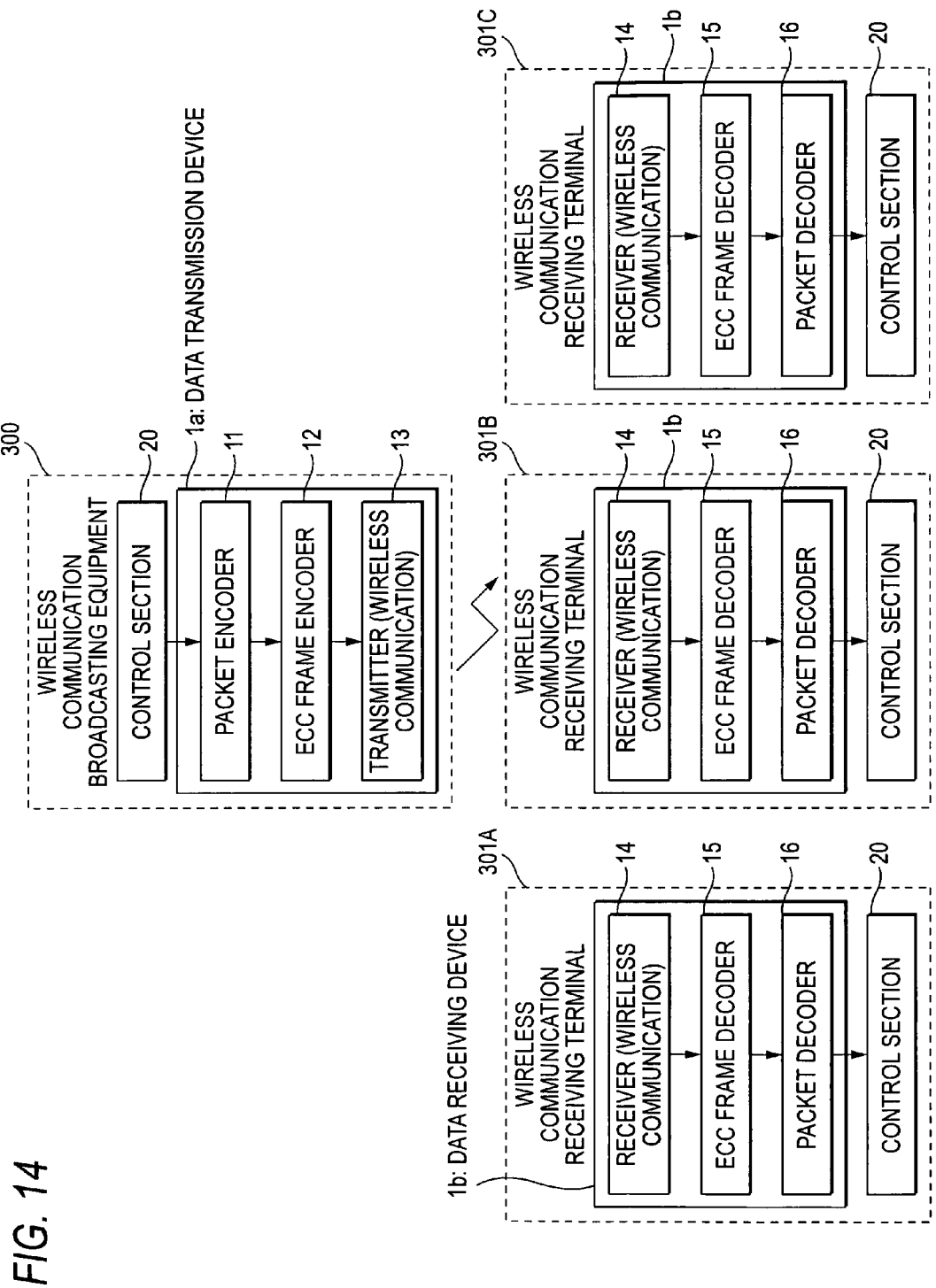
FIG. 14 is a diagram showing an example in which one-to-many communication is performed according to the first exemplary embodiment of the invention.

FIG. 14 shows an example in which one-to-many communication is performed. For example, a system is configured to have one wireless communication broadcasting equipment 300 and plural wireless communication receiving terminals 301A to 301C.

The wireless communication broadcasting equipment 300 includes a data transmission device 1a that has only a transmission-side function of the data transmission apparatus 1 shown in FIG. 2. Each wireless communication receiving terminal 301A to 301C includes a data transmission device 1b that has only a reception-side function of the data transmission apparatus 1 shown in FIG. 2. A transmitter 13 and a receiver 14 which are shown in the figure have wireless communication functions.

According to this system, a request for retransmission from the reception side to the transmission side is not needed in the case where an error occurs. Thus, an application example in which data is transmitted and received in one direction can be considered. For example, an application example (transmission and reception of digital voice data or motion picture data) in which the same information is broadcast from one wireless communication broadcasting equipment 300 to the plural wireless communication receiving terminals 301A to 301C may be considered.

Figure 15:
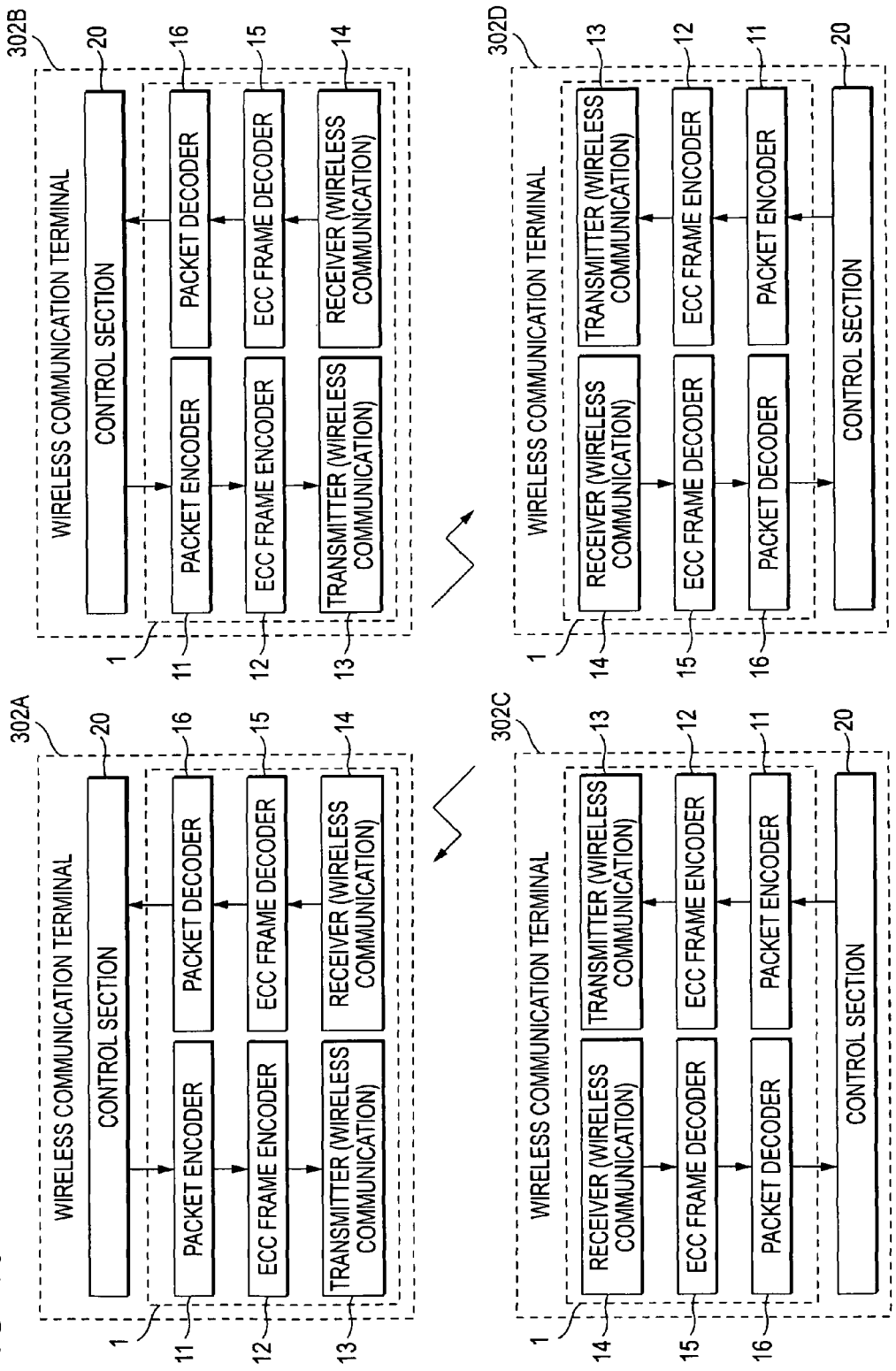
FIG. 15 is a diagram showing an example in which many-to-many communication is performed according to the first exemplary embodiment of the invention.

FIG. 15 shows an example in which one-to-many communication is performed. By extending one-to-many communication, an application example in which a reception section and a transmission section are provided on each side for mutual communication may be considered. For example, a system is configured to have plural wireless communication terminals 302A to 302D which are connected with one another using wireless communication.

Each wireless communication terminal 302A to 302D includes a data transmission apparatus 1 having both functions of transmission and reception sides, like the data transmission apparatus 1 shown in FIG. 2.

In this system, although packets transmitted from the wireless communication terminals 302A to 302D are received by all the other wireless communication receiving terminals 302A to 302D, the packets may be taken or removed inside each wireless communication receiving terminals 302A to 302D as is needed. Accordingly, all the terminals can communicate with one another. For example, this system may be applied to a wireless LAN or the like.

Second Exemplary Embodiment

A second exemplary embodiment of the invention will be described below. In the second exemplary embodiment, similar reference numerals are assigned to components that are similar to those in the first exemplary embodiment, and redundant description thereon will be omitted.

Figure 16:
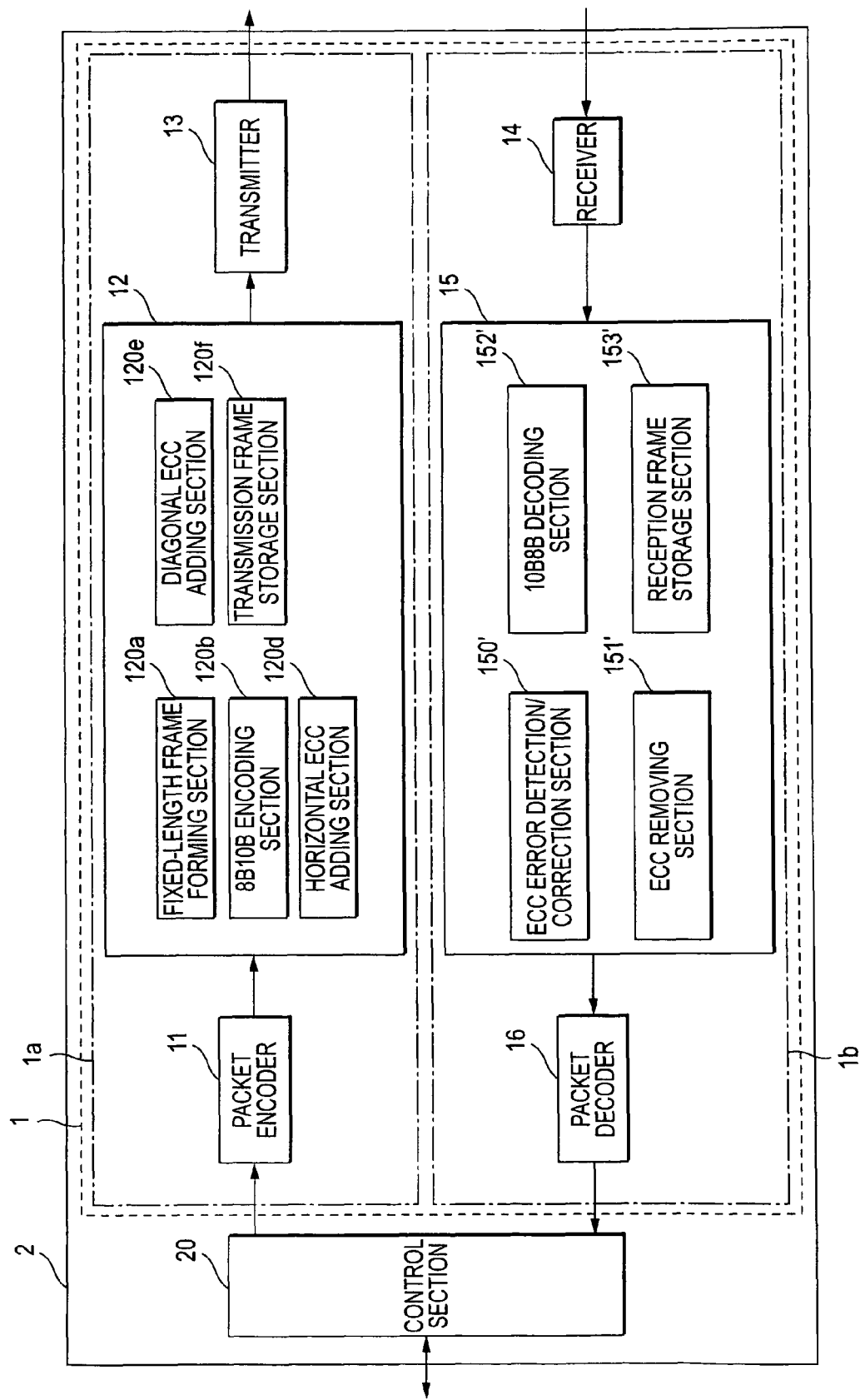
FIG. 16 is a block diagram of a data transmission apparatus according to a second exemplary embodiment of the invention, disposed in a host bus I/F.

FIG. 16 is a block diagram of a data transmission apparatus according to the second exemplary embodiment of the invention disposed in the host bus I/F 2.

(ECC Frame Encoder)

The ECC frame encoder 12 of the second exemplary embodiment includes a fixed-length frame forming section 120a, an 8B10B encoding section 120b, a horizontal ECC adding section 120d, a diagonal ECC adding section 120e, and a transmission frame storage section 120f.

In the transmission frame storage section 120f, plural ECC frames generated by the ECC frame encoder 12 is stored in a time series manner.

The fixed-length frame forming section 120a sequentially forms frames (hereinafter, referred to as "fixed-length frames"), each of which is constituted by plural blocks and has a predetermined length, by dividing the packet generated by the packet encoder 11 or adding dummy data to the packet. Here, for example, when the length of the fixed-length frame is 64 bits and the length of one block is 8 bits, the fixed-length frame is constituted by 8 blocks.

The 8B10B encoding section 120b performs an encoding process (DC balance conversion) using 8B10B conversion, for example, for the 64-bit fixed-length frame formed by the fixed-length frame forming section 120a, to form an 80-bit fixed-length frame. Here, a DC balance conversion method such as 4B5B conversion or 64B66B conversion other than the encoding process using 8B10B conversion may be used.

The horizontal ECC adding section 120d calculates a horizontal ECC from plural blocks included in the fixed-length frame for which the encoding process has been performed by the 8B10B encoding section 120b and adds the horizontal ECC to the fixed-length frame.

The diagonal ECC adding section 120e calculates a diagonal ECC from plural blocks arranged that are arranged, in a diagonal direction, in the plural blocks included in the plural fixed-length frames when (i) the fixed-length frame for which the encoding process has been performed by the 8B10B encoding section 120b and (ii) plural ECC frames stored in the transmission frame storage section 120f are arranged in parallel to one another in time series. Then, the diagonal ECC adding section 120e adds the calculated diagonal ECC to the fixed-length frame to which the horizontal ECC has been added.

As the horizontal ECC and the diagonal ECC, which are added by the horizontal ECC adding section 120d and the diagonal ECC adding section 120e, a publicly known error correcting code such as a Hamming code, a Manchester code or, a Reed-solomon code may be used.

(ECC Frame Decoder)

The ECC frame decoder 15 includes: an ECC error detection/correction section 150' that receives an ECC frame as parallel data transmitted from a receiver 14 and performs an ECC error detection/correction operation based on the horizontal ECC and the diagonal ECC included in the ECC frame; an ECC removing section 151' that removes the horizontal ECC and the diagonal ECC from the ECC frame; a 10B8B decoding section 152' that performs a decoding process, using the 10B8B conversion, for the fixed-length frame from which the horizontal ECC and the diagonal ECC have been removed; and a reception frame storage section 153' that stores the plural ECC frames received.

(Configuration of Packet)

The configuration of the packet generated by the packet encoder 11 is substantially same as that described with reference to FIGS. 3 and 4 in the first exemplary embodiment. Thus, the duplicate description thereon will be omitted here.

(Whole Operation of Data Transmission Apparatus)

(1) Operation of Transmission Side

Next, operations of the data transmission apparatus 1 on the transmission side (data transmission device 1a) according to the second exemplary embodiment will be described with reference to FIGS. 17 to 21. FIG. 17 is a diagram showing the flow of an encoding process in the ECC frame encoder 12 according to the second exemplary embodiment before serial transmission.

The packet encoder 11 of the data transmission apparatus 1 generates a packet in accordance with a request from the control section 20, which controls the host bus I/F 2.

The fixed-length frame forming section 120a of the ECC frame encoder 12, as shown in FIG. 17A, forms a fixed-length frame 201 of, for example, 64 bits by dividing the packet generated by the packet encoder 11 or by adding dummy data to the packet.

The 64-bit fixed-length frame 201 is formed at a predetermined cycle and output regardless of existence of a packet to be transmitted. At this time, if there is no packet to be transmitted, the fixed-length frame is configured of 64 bits with being filled with an NOP symbol (a symbol that is ignored on the reception side). On the other hand, if there is a packet to be transmitted, 64 bits including the packet are configured. If the length of one packet exceeds 64 bits, leading 64 bits of the packet are processed, and then the following (remaining) 64 bits of the packets are processed at the next timing.

As shown in FIG. 17B, the 8B10B encoding section 120b performs the 8B10B conversion for the fixed-length frame, to generate an 80-bit fixed-length frame 202. At this time, special symbols such as the SOP, the EOP, and the NOP are converted into corresponding K characters. The correspondence relationship between the special symbols and the K characters is shown in FIG. 18, as an example.

Next, the horizontal ECC adding section 120d adds the horizontal ECC 204' to the 80-bit frame for which the encoding process using the 8B10B conversion has been performed. Also, the diagonal ECC adding section 120e adds the diagonal ECC 205' to the frame to which the horizontal ECC 204' has been added, to generate the ECC frame 203 as shown in FIG. 17C. The detailed method of calculating the horizontal ECC 204' and the diagonal ECC 205' will be described later.

FIG. 19 is a diagram showing examples of the horizontal ECC 204' and the diagonal ECC 205' which are added to the fixed-length frame. Since the horizontal ECC 204' and the diagonal ECC 205' are not encoded using the 8B10B conversion, inverted 8 bits are added in consideration of the DC balance. Also, 2 bits as shown in FIG. 19 are added to each 8 bits. Hereinafter, the entire 120 bits are collectively referred to as an ECC frame.

Figure 20:
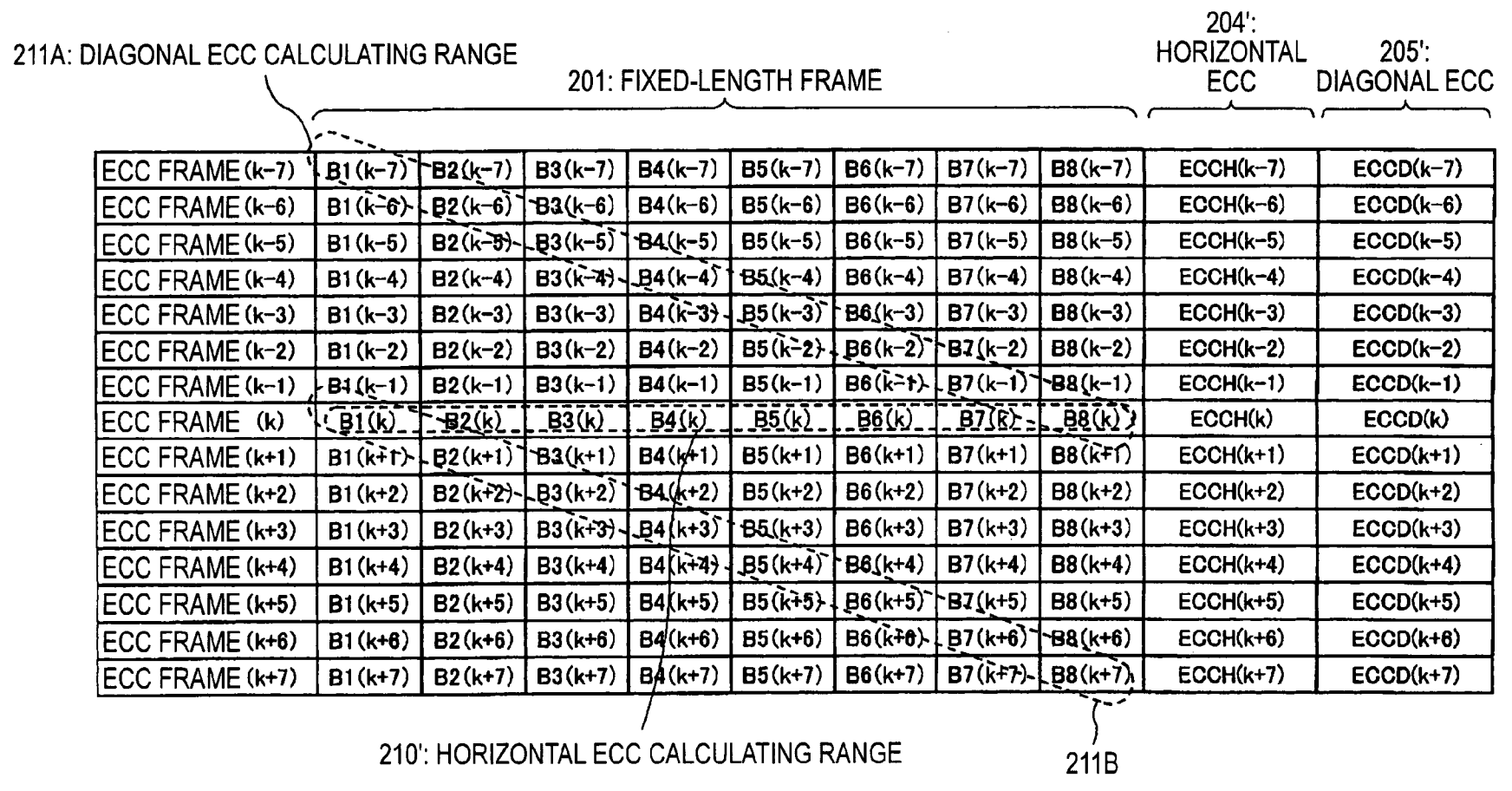

Next, the methods of calculating the horizontal ECC 204' and the diagonal ECC 205' will be described with reference to FIG. 20. FIG. 20 is a diagram showing an example of a state where the plural ECC frames are arranged in parallel to one another in time series. An ECC frame(k) represents an ECC frame generated at time k. 8 blocks B1(k) to B8(k) represent blocks formed by dividing the 80-bit fixed-length frame included in the ECC frame (k) into 8 blocks so that each block has 10 bits. Also, ECCH(k) and ECCD(k) represent the horizontal ECC 204' and the diagonal ECC 205' which are included in the ECC frame(k).

At time k, the transmission frame storage section 120f stores, as ECC frames already transmitted, (time k−(division number of blocks−1)×frames, that is, 7 ECC frames in total from an ECC frame (k−7 at time "k−7" to and ECC frame (k−1) at time "k−1".

The horizontal ECC adding section 120d calculates ECCH (k), as a horizontal ECC 204', from the plural blocks included in the ECC frame (k), that is, 8 blocks {B1(k), B2(k), . . . B8(k)} included in a horizontal ECC calculating range 210' shown in FIG. 20. Then, the horizontal ECC adding section 120d adds the ECCH(k) to the ECC frame (k).

Next, the diagonal ECC adding section 120e calculates ECCD(k), as a diagonal ECC 205', from plural blocks arranged, in the diagonal direction, in the plural blocks included in the 8 ECC frames of the ECC frame (k−7) to the ECC frame (k), which are arranged in parallel in time series, that is, 8 blocks {B1(k−7), B2(k−6), . . . , B8(k)} included in a diagonal ECC calculating range 211A shown in FIG. 20. Then, the diagonal ECC adding section 120e adds the ECCD (k) to the ECC frame (k) to which the ECCH(k) has been added. Also, at time "k+7," the diagonal ECC adding section 120e calculates a diagonal ECC 205' from 8 blocks included in a diagonal ECC calculating range 211B shown in FIG. 20.

In the above-described example, the diagonal ECC adding section 120e defines the diagonal ECC calculating range used to calculate the diagonal ECC 205' to extend from the upper left side to the lower right side. However, for example, the diagonal ECC calculating range may be defined to extend from the upper right side to the lower left side. Also, in the above-described example, one block is formed of 10 bits. However, for example, one block may be formed of 20 bits, and the number of bits constituting one block is not limited thereto. If one block is formed of 20 bits, four blocks arranged in the diagonal direction in four frames, that are arranged in parallel in time series, may be defined as the diagonal ECC calculating range.

Figure 21:
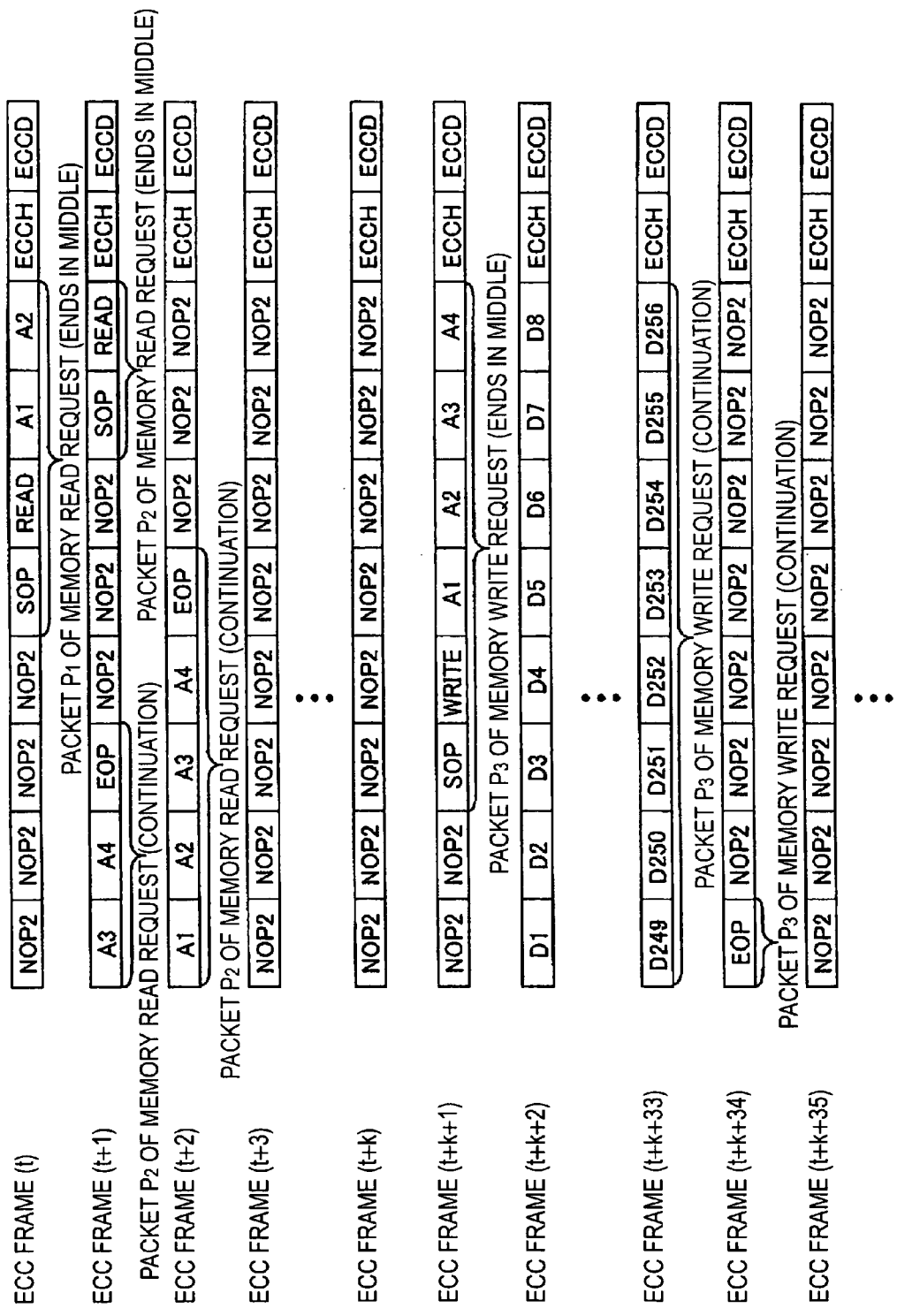
FIG. 21 is a diagram showing an example of plural ECC frames in which packets are embedded according to the second exemplary embodiment of the invention.

FIG. 21 is a diagram showing an example of plural ECC frames into which packets are embedded. As shown in FIG. 21, packets that are generated based on the packet configuration shown in FIG. 3 are embedded in each of the blocks B1 to B8 of the ECC frame shown in FIG. 20. Reference symbols A1 to A4 each represents a one-byte address. Reference symbols D1 to D256 each represents one-byte data. The ECC frame (t) represents an ECC frame generated at time t.

Contents of one packet may be included in tow ECC frames like ECC frames "ECC frame (t)" to "ECC frame (t+1)." In other words, there may be a case where a part of plural packets is included in one ECC frame, like the "ECC frame (t+1)." Also, there may be a case where no packet is included in the ECC frame like "ECC frame (t+3)," "ECC frame (t−k)," and "ECC frame (t+k+35)." Furthermore, there may be a case where one packet is included in plural ECC frames like "ECC frame (t+k+1)," "ECC frame (t+k+2)," ECC frame (t+k+33)," and "ECC frame (t+k+34)."

Then, the ECC frame encoder 12 divides the generated ECC frame 203' into six pieces of 20-bit data as data 206' shown in FIG. 17D and output 20 bit-data to the transmitter 13 for each clock cycle, that is, output 20-bit data six times.

In addition, the ECC frame encoder 12 transmits the generated ECC frame 203' to the transmission frame storage section 120f. Then, the transmission frame storage section 120f stores the ECC frames 203' in time series. ECC frames that become unnecessary for calculating the diagonal ECC 205' from among the ECC frames stored in the transmission frame storage section 120f may be sequentially deleted.

The transmitter 13 converts the 20-bit data transmitted from the ECC frame encoder 12 from parallel data into serial data, and sequentially outputs the converted data to the transmission line.

(2) Process Operation on Reception Side

Next, a decoding process performed on the reception side (data reception device 1b) of the data transmission apparatus 1 according to the second exemplary embodiment after serial transmission will be described.

The receiver 14 performs serial-to-parallel conversion for the serial data input from the transmission line and transmits 20-bit parallel data to the ECC frame decoder 15 for each clock cycle.

When receiving the 20-bit parallel data, the ECC error/detection/correction section 150' of the ECC frame decoder 15 generates 120-bit data by bringing the parallel data for 6 cycles together, and stores the 120-bit data in the reception frame storage section 153' in time series as one ECC frame.

Next, the ECC error detection/correction section 150' performs an error detection/correction operation based on the horizontal ECC 204' and the diagonal ECC 205', which are included in the ECC frame.

Specifically, when completing reception of the ECC frame (k) transmitted at time k, the ECC error detection/correction section 150' stores the ECC frame (k) in the reception frame storage section 153'. Then, the ECC error detection/correction section 150' acquires an ECC frame (k−7) received at the "k−7" from the reception frame storage section 153' and performs the error detection/correction operation for the ECC frame (k−7).

In other words, the ECC error detection/correction section 150' performs the error detection operation for the fixed-length frame 202 constituted by blocks B1(k−7), B2 (k−7), . . . , B8(k−7) based on the ECCH(k−7), which is a horizontal ECC 204' included in the ECC frame (k−7).

It is assumed that ErrH(k−7) denotes the number of horizontal error bits detected by the horizontal ECC 204'. The ECC error detection/correction section 150' transmits the ECC frame (k−7) to the ECC removing section 151' if ErrH (k−7) is equal to "0", that is, if no error is detected.

If ErrH(k−7) is equal to "3," that is, a correctable error is detected, the ECC error detection/correction section 150' corrects the detected error based on the horizontal ECC 204' and transmits the ECC frame (k−7) for which the correction has been made, to the ECC removing section 151'.

On the other hand, if ErrH(k−7) is equal to or larger than "2," that is, an uncorrectable error is detected, the ECC error detection/correction section 150' acquires "ECC frame (k−6)" to "ECC frame (k)" as well as the "ECC frame (k−7)" from the reception frame storage section 153'.

Then, the ECC error detection/correction section 150' detects errors for corresponding diagonal ECC calculating ranges based on 8 diagonal ECCs 205 of ECCD(k−7), ECCD (k−6), . . . , ECCD(k) included in 8 ECC frames of "ECC frame (k−7)" to "ECC frame (k)."

It is assumed that ErrD(k−7), ErrD(k−6), . . . , and ErrD(k) denote the numbers of error bits detected based on the 8 diagonal ECCs 205, respectively. The ECC error detection/correction operation for a diagonal ECC calculating range which has the number of detected diagonal error bits equal to "1."

Next, it is assumed that a "diagonal-correction completed ECC frame (k−7)" denotes the "ECC frame (k−7)" for which the error correction operation has been performed based on the diagonal ECC 205'. The ECC error detection/correction section 150' again performs the error detection operation for the diagonal-correction completed ECC frame (k−7) based on ECCH(k−7) which is the horizontal ECC 204'.

Then, if detecting no error as a result of the error redetection operation based on the horizontal ECC 204', the ECC error detection/correction section 150' transmits the diagonal/correction completed ECC frame (k−7) to the ECC removing section 151'.

If detecting an correctable error as a result of the error redetection operation based on the horizontal ECC 204', the ECC error detection/correction section 150' corrects the error of the diagonal-correction completed ECC frame (k−7) based on the horizontal ECC 204' again and transmits the horizontal-correction completed ECC frame (k−1) for which the error correction operation has been performed based on the horizontal ECC 204', to the ECC removing section 151'.

On the other hand, if detecting an uncorrectable error as the result of the error redetection operation based on the horizontal ECC 204', the ECC error detection/correction section 150' notifies the control section 20 of a maximum number of error bits from among numbers of the error bits ErrD(k−7), ErrD (k−6), . . . , and ErrD(k) which are detected based on the 8 diagonal ECCs 205.

In the above-described example, the ECC error detection/correction section 150' performs the error detection/correction operation based on the diagonal ECC 205' after performing the error detection/correction operation based on the horizontal ECC 204'. However, the ECC error detection/correction section 150' may be configured to perform the error detection/correction operation based on the horizontal ECC 204' after performing the error detection/correction operation based on the diagonal ECC 205'. Also, the error detection/correction operations based on the horizontal ECC 204' and the diagonal ECC 205' may be performed alternately plural times.

In the above-described example, the ECC error detection/correction section 150' performs the error detection/correction operation for one frame (k−7) based on one horizontal ECC "ECCH(k)" and 8 diagonal ECCs ECCD(k−7), ECCD (k−6), . . . , and ECCD(k). However, for example, the ECC error detection/correction section 150' may collectively perform the error detection/correction operations for 8 frames frame (k−7) to frame (k) based on 8 horizontal ECCs {ECCH (k−7), ECCH(k−6), . . . , and ECCH(k)} and 8 diagonal ECCs {ECCD(k−7), ECCD(k−6), . . . , and ECCD(k)}.

Then, the ECC removing section 151' removes the horizontal ECC 204' and the diagonal ECC 205' from the ECC frame transmitted from the ECC error detection/correction section 150'. Thereby, the ECC frame 203' becomes an 80-bit fixed-length frame 202.

Then, the 10B8B decoding section 152' performs a decoding process using the 10B8B conversion for the 80-bit fixed-length frame 202, to thereby restore the 64-bit fixed-length frame 201.

Then, the ECC frame decoder 15 deletes 8 bits representing NOP among each 8 bits included in the restored 64 bits and transmits the remaining data to the packet decoder 16.

The packet decoder 16 acquires data from the ECC frame decoder 15 and extracts one packet by detecting SOP and EOP included in the data.

Then, the packet decoder 16 notifies the host computer 101 of completion of the process through the control section 20 based on the type of the extracted packet and replies data included in the packet.

As described above, the data transmission apparatus 1 according to the second exemplary embodiment performs the error detection/correction operation based on the horizontal ECC 204' and the diagonal ECC 205'. For example, it is assumed that the probability of occurrence of 1-bit transmission error in the data transmission apparatus 1 is "$10^{-12}$." In this case, the probabilities $P_{ECCH}$ and $P_{ECCD}$ that a 2-bit error is detected based on the horizontal ECC 204' and the diagonal ECC 205' can be calculated by the following equations Equation A and Equation B.

$$P_{ECCH} = 10^{-12} \times 10^{-12} \times {}_{120}C_2 \approx 7 \times 10^{-21} \quad \text{(Equation A)}$$

$$P_{ECCD} = 10^{-12} \times 10^{-12} \times {}_{120}C_2 \approx 7 \times 10^{-21} \quad \text{(Equation B)}$$

Also, the probability that a 2-bit error is detected in one ECC frame based on the horizontal ECC 204' and a 2-bit error is detected based on any of 8 diagonal ECCs 205, that is, the probability P that an uncorrectable transmission error occurs in the data transmission apparatus 1 can be acquitted by the following equation "Equation C".

$$P = P_{ECCH} \times (1 - (1 - P_{ECCD})^8) \quad \text{(Equation C)}$$
$$= 7 \times 10^{-21} \times (1 - (1 - 7 \times 10^{-21})^8)$$
$$\approx 10^{-40}$$

Other Exemplary Embodiments

The invention is not limited to the above-described exemplary embodiments, and various changes and modifications can be made thereto without departing from the gist of the invention. Furthermore, the constituent components of the above-described exemplary embodiments may be arbitrary combined without departing from the gist of the invention.

What is claimed is:

1. A data transmission apparatus comprising:
   a packet generation section that generates a packet upon request;
   a frame encoding section that generates a frame having a predetermined length by dividing the packet or adding dummy data to the packet and generates an error-correcting-code-added frame by adding an error correcting code to the frame;
   a transmission section that transmits the generated error-correcting-code-added frame through a transmission line;
   a reception section that receives the error-correcting-code-added frame through the transmission line;
   a frame decoding section that performs an error detection and an error correction for the error-correcting-code-added frame; and
   a packet extraction section that extracts the packet by removing the error correcting code from the error-correcting-code-added frame for which the error detection and the error correction have been performed;
   the frame encoding section comprising:
      a frame forming section that forms the frame having the predetermined length;
      a DC balance converting section that performs a DC balance conversion for the formed frame; and
      an error correcting code adding section that adds the error correcting code to the frame for which the DC balance conversion has been performed and outputs the error-correcting-code-added frame to the transmission section;
   the frame decoding section comprising:
      an error detection/correction section that performs the error detection and the error correction for the error-correcting-code-added frame;
      an error correcting code removing section that removes the error correcting code from the error-correcting-code-added frame; and
      a DC inverse balance converting section that performs a DC inverse balance conversion for the frame from which the error correcting code has been removed and outputs the resultant frame to the packet extraction section.

2. The data transmission apparatus according to claim 1, wherein when the frame encoding section generates a first error-correcting-code-added frame after a clock compensation sequence that inserts a sequence having a predetermined symbol between the error-correcting-code-added frames to correct a reception timing, the frame encoding section arranges a control symbol, that has 2 or more in Hamming distance from a control symbol for clock compensation, in a leading portion of the first error-correcting-code-added frame.

3. The data transmission apparatus according to claim 2, wherein the frame encoding section adds information that distinguishes the error correcting code from other control symbols, to the error correcting code.

4. The data transmission apparatus according to claim 1, wherein
   at a time of the clock compensation sequence, which inserts the sequence having an idle symbol between the error-correcting-code-added frames to correct the reception timing, the frame encoding section generates data in which a certain number of idle symbols are formed as one set and transmits the generated data to the transmission section, the certain number being equal to or larger than 2, and the frame decoding section corrects the reception timing when (i) a part of the certain number of symbols received at the time of the clock compensation sequence is identical to the idle symbol and (ii) a difference between a symbol, of the certain number of symbols, other than the idle symbol and the idle symbol is equal to or smaller than one bit.

5. The data transmission apparatus according to claim 1, wherein the frame encoding section generates the error-correcting-code-added frame including an idle symbol for clock compensation at a time of a clock compensation sequence that corrects a reception timing and the transmission section transmits the generated error-correcting-code-added frame.

6. The data transmission apparatus according to claim 1, wherein:
the frame encoding section comprises
a frame forming section that divides the packet generated by the packet generation section into a plurality of blocks and sequentially forms frames each having the plurality of blocks,
a horizontal error correcting code adding section that calculates a horizontal error correcting code from the plurality of blocks included in a certain frame formed by the frame forming section and adds the calculated horizontal error correcting code to the certain frame,
a diagonal error correcting code adding section that calculates a diagonal error correcting code from a plurality of blocks that are arranged, in a diagonal direction, in the plurality of blocks included in the plurality of frames when the plurality of frames sequentially formed by the frame forming section are arranged in parallel to one another in time series, the diagonal error correcting code adding section that adds the calculated diagonal error correcting code to the certain frame to which the horizontal error correcting code has been added,
the transmission section transmits, through the transmission line, the error-correcting-code-added frame to which the horizontal error correcting code and the diagonal error correcting code are added;
the frame decoding section performs the error detection and the error correction for the error-correcting-code-added frame received by the reception section based on the horizontal error correcting code and the diagonal error correcting code; and
the packet extraction section extracts the packet by removing the horizontal error correcting code and the diagonal error correcting code from the error-correcting-code-added frame for which the error detection and the error correction have been performed.

7. The data transmission apparatus according to claim 6, wherein
the frame decoding section performs the error detection and the error correction for the error-correcting-code-added frame based on the horizontal error correcting code, and
when detecting an uncorrectable error, the frame decoding section performs the error detection and the error correction, based on the diagonal error correcting code, for the error-correcting-code-added frame for which the error detection and the error correction has been performed based on the horizontal error correcting code.

8. The data transmission apparatus according to claim 6, wherein
the frame decoding section performs the error detection and the error correction for the error-correcting-code-added frame based on the diagonal error correcting code, and
when detecting an uncorrectable error, the frame decoding section performs the error detection and the error correction, based on the horizontal error correcting code, for the error-correcting-code-added frame for which the error detection and the error correction has been performed based on the diagonal error correcting code.

9. The data transmission apparatus according to claim 1, wherein
the frame encoding section comprises
a frame forming section that forms at least k+n−1 frames each having n blocks where n is an integer equal or larger than 2 and k is an integer equal to or larger than n, each block having a predetermined number of bits,
a horizontal error correcting code adding section that calculates a horizontal error correcting code ECCH (k) from the blocks $\{B_1(k), B_2(k), \ldots, \text{and } B_n(k)\}$ included in a k-th frame formed by the frame forming section, the horizontal error correcting code adding section that adds the calculated horizontal error correcting code ECCH(k) to the k-th frame,
a diagonal error correcting code adding section that calculates a diagonal error correcting code ECCD(j) from the n blocks $\{B_1(j-n+1), B_2(j-n+2), \ldots, \text{and } B_n(j)\}$ of the blocks included in a (j−n+1)-th frame to a j-th frame formed by the frame forming section where j is an integer equal to or larger than k and equal to or less than k+n−1, the diagonal error correcting code adding section that adds the calculated diagonal error correcting code ECCD(j) to the (j−n+1) th frame to the j-th frame,
the transmission section transmits, through the transmission line, the frames including the frames to which the horizontal error correcting codes or the diagonal error correcting codes are added,
the reception section receives the frames transmitted by the transmission section, through the transmission line, and
the frame decoding section performs the error detection and the error correction for the K-th frame received by the reception section based on the horizontal error correcting code ECCH(k) included in the (k)-th frame and n diagonal error correcting codes {ECCD(k), ECCD(k+1), . . . , and ECCD(k+n−1)} included in the n frames.

10. The data transmission apparatus according to claim 9, wherein
the frame decoding section performs the error detection and the error correction for the k-th frame based on the horizontal error correcting code ECCH(k),
when a number of detected error bits is equal to or less than one, the frame decoding section notifies a higher level apparatus of the number of detected error bits, and
when the number of detected error bits is equal to or larger than two, the frame decoding section performs the error detection and the error correction for the k-th frame based on the n diagonal error correcting codes {ECCD (k), ECCD(k+1), . . . , and ECCD(k+n−1)} and notifies the higher level apparatus of a maximum number of error bits among n numbers of error bits that are detected using the n diagonal error correcting codes.

11. A data transmission device comprising:
a packet generation section that generates a packet upon request;

an encoding unit that generates a frame having a predetermined length by dividing the packet or adding dummy data to the packet and generates an error-correcting-code-added frame by adding an error correcting code to the frame; and
a transmission section that transmits the error-correcting-code-added frame through a transmission line;
the encoding unit comprising:
a frame forming section that forms the frame having the predetermined length;
a DC balance converting section that performs a DC balance conversion for the formed frame; and
an error correcting code adding section that adds the error correcting code to the frame for which the DC balance conversion has been performed and outputs the error-correcting-code-added frame to the transmission section.

12. The data transmission device according to claim 11, comprising:
the encoding unit comprises a frame forming section that sequentially forms frames each having a plurality of blocks,
a horizontal error correcting code adding section that calculates a horizontal error correcting code from the plurality of blocks included in a certain frame formed by the frame forming section and adds the calculated horizontal error correcting code to the certain frame, and
a diagonal error correcting code adding section that calculates a diagonal error correcting code from a plurality of blocks that are arranged, in a diagonal direction, in the plurality of the blocks included in the plurality of frames when the plurality of frames sequentially formed by the frame forming section are arranged in parallel to one another in time series, the diagonal error correcting code adding section that adds the calculated diagonal error correcting code to the certain frame to which the horizontal error correcting code has been added, and
the transmission section that transmits, through the transmission line, the error-correcting-code-added frame to which the horizontal error correcting code and the diagonal error correcting code has been added.

13. A data reception device comprising:
a reception section that receives, through a transmission line, an error-correcting-code-added frame generated by adding an error correcting code to a frame that has a predetermined length and that is generated by dividing a packet or adding dummy data to the packet;
a frame decoding section that performs an error detection and an error correction for the error-correcting-code-added frame; and
a packet extraction section that extracts the packet by removing the error correcting code from the error-correcting-code-added frame for which the error detection and the error correction have been performed;
the frame decoding section comprising:
an error detection/correction section that performs the error detection and the error correction for the error-correcting-code-added frame;
an error correcting code removing section that removes the error correcting code from the error-correcting-code-added frame; and
a DC inverse balance converting section that performs a DC inverse balance conversion for the frame from which the error correcting code has been removed and outputs the resultant frame to the packet extraction section.

14. The data reception device according to claim 13, wherein
the reception section receives the error-correcting-code-added frame generated by adding, to a certain frame, a horizontal error correcting code calculated from a plurality of blocks included in the certain frame and a diagonal error correcting code calculated from a plurality of blocks that are arranged, in a diagonal direction, in a plurality of blocks included in a plurality of frames when the plurality of the frames are arranged in parallel to one another in time series, and
the frame decoding section performs the error detection and the error correction for the error-correcting-code-added frame received by the reception section based on the horizontal error correcting code and the diagonal error correcting code.

15. A data transmission system comprising:
a packet generation section that generates a packet upon request;
a frame encoding section that generates a frame having a predetermined length by dividing the packet or adding dummy data to the packet and generates an error-correcting-code-added frame by adding an error correcting code to the frame;
a transmission section that transmits the generated error-correcting-code-added frame;
a transmission line that is connected to the transmission section and transmits the error-correcting-code-added frame;
a reception section that receives the error-correcting-code-added frame through the transmission line;
a frame decoding section that performs an error detection and an error correction for the error-correcting-code-added frame; and
a packet extraction section that extracts the packet by removing the error correcting code from the error-correcting-code-added frame for which the error detection and the error correction have been performed;
the frame encoding section comprising:
a frame forming section that forms the frame having the predetermined length;
a DC balance converting section that performs a DC balance conversion for the formed frame; and
an error correcting code adding section that adds the error correcting code to the frame for which the DC balance conversion has been performed and outputs the error-correcting-code-added frame to the transmission section;
the frame decoding section comprising:
an error detection/correction section that performs the error detection and the error correction for the error-correcting-code-added frame;
an error correcting code removing section that removes the error correcting code from the error-correcting-code-added frame; and
a DC inverse balance converting section that performs a DC inverse balance conversion for the frame from which the error correcting code has been removed and outputs the resultant frame to the packet extraction section.

16. The data transmission system according to claim 15, wherein
the encoding unit comprises
a frame forming section that sequentially forms frames each having a plurality of blocks,
a horizontal error correcting code adding section that calculates a horizontal error correcting code from the plurality of blocks included in a certain frame formed by the frame forming section and adds the calculated horizontal error correcting code to the certain frame, and a diagonal error correcting code adding section that calculates a diagonal error correcting code from a plurality of blocks that are arranged, in a diagonal direction, in the plurality of the blocks included in the plurality of frames when the plurality of frames sequentially formed by the frame forming section are arranged in parallel to one another in time series, the diagonal error correcting code adding section that adds the calculated diagonal error correcting code to the certain frame to which the horizontal error correcting code has been added, the transmission section that transmits, through the transmission line, the error-correcting-code-added frame to which the horizontal error correcting code and the diagonal error correcting code has been added, and the frame decoding section performs the error detection and the error correction for the error-correcting-code-added frame received by the reception section based on the horizontal error correcting code and the diagonal error correcting code.

* * * * *